(12) United States Patent
Kim et al.

(10) Patent No.: US 10,983,558 B2
(45) Date of Patent: Apr. 20, 2021

(54) BIOMETRIC SENSOR AND DEVICE INCLUDING THE SAME

(71) Applicant: SAMSUNG ELECTRONICS CO., LTD., Suwon-si (KR)

(72) Inventors: Hyun Woo Kim, Gumi-si (KR); Ji Hoon Park, Suwon-si (KR); Ji Hun Heo, Suwon-si (KR); Joo Han Kim, Gumi-si (KR); Jin Man Kim, Gumi-si (KR); Bong Jae Rhee, Gyeonggi-do (KR); Se Young Jang, Seongnam-si (KR)

(73) Assignee: Samsung Electronics Co., Inc., Suwon-si (KR)

( * ) Notice: Subject to any disclaimer, the term of this patent is extended or adjusted under 35 U.S.C. 154(b) by 0 days.

(21) Appl. No.: 16/945,971

(22) Filed: Aug. 3, 2020

(65) Prior Publication Data

US 2020/0364433 A1  Nov. 19, 2020

Related U.S. Application Data

(63) Continuation of application No. 16/808,474, filed on Mar. 4, 2020, which is a continuation of application No. 15/949,253, filed on Apr. 10, 2018.

(30) Foreign Application Priority Data

Apr. 11, 2017  (KR) .................. 10-2017-0046972

(51) Int. Cl.
*G06K 9/00* (2006.01)
*G06F 3/042* (2006.01)
(Continued)

(52) U.S. Cl.
CPC .......... *G06F 1/1626* (2013.01); *G06F 1/1643* (2013.01); *G06F 1/1684* (2013.01);
(Continued)

(58) Field of Classification Search
CPC .............. G06K 9/0002; G06K 9/0004; G06K 9/00053; G06F 1/1626; G06F 1/1643;
(Continued)

(56) References Cited

U.S. PATENT DOCUMENTS 5,869,791 A  2/1999  Young
6,327,376 B1  12/2001  Harkin
(Continued)

FOREIGN PATENT DOCUMENTS

CN  101681047 A  3/2010
CN  104182727 A  12/2014
(Continued)

OTHER PUBLICATIONS

U.S. Appl. No. 16/808,474, filed Mar. 4, 2020; Kim et al.
(Continued)

*Primary Examiner* — Antonio Xavier
(74) *Attorney, Agent, or Firm* — Nixon & Vanderhye P.C.

(57) ABSTRACT

A display device includes a display panel, a cover glass disposed on the display panel, and a biometric sensor device disposed below the display panel. The biometric sensor device includes a printed circuit board, a biometric sensor disposed on the printed circuit board, and a housing disposed on the printed circuit board and in which an opening is formed. The biometric sensor is disposed in the opening of the housing and is attached to a surface of the display panel through the housing.

23 Claims, 13 Drawing Sheets

(51) Int. Cl.
| | |
|---|---|
| *G06F 1/16* | (2006.01) |
| *H05K 1/18* | (2006.01) |
| *H05K 5/00* | (2006.01) |
| *G06F 3/041* | (2006.01) |
| *H04M 1/02* | (2006.01) |
| *H05K 1/02* | (2006.01) |
| *H05K 5/03* | (2006.01) |
| *H05K 1/14* | (2006.01) |
| *H01L 27/146* | (2006.01) |
| *H01L 23/00* | (2006.01) |
| *H01L 27/32* | (2006.01) |

(52) U.S. Cl.
CPC ............ *G06F 3/042* (2013.01); *G06F 3/0412* (2013.01); *G06F 3/0414* (2013.01); *G06F 3/0421* (2013.01); *G06K 9/0002* (2013.01); *G06K 9/0004* (2013.01); *G06K 9/00053* (2013.01); *H04M 1/026* (2013.01); *H04M 1/0266* (2013.01); *H04M 1/0277* (2013.01); *H05K 1/181* (2013.01); *H05K 1/189* (2013.01); *H05K 5/0017* (2013.01); *H05K 5/0086* (2013.01); *G06F 2203/04109* (2013.01); *H01L 24/32* (2013.01); *H01L 24/48* (2013.01); *H01L 24/73* (2013.01); *H01L 27/14618* (2013.01); *H01L 27/14625* (2013.01); *H01L 27/14636* (2013.01); *H01L 27/323* (2013.01); *H01L 27/3234* (2013.01); *H01L 27/3276* (2013.01); *H01L 2224/32225* (2013.01); *H01L 2224/48091* (2013.01); *H01L 2224/48106* (2013.01); *H01L 2224/48227* (2013.01); *H01L 2224/73265* (2013.01); *H05K 1/0203* (2013.01); *H05K 1/147* (2013.01); *H05K 5/03* (2013.01); *H05K 2201/066* (2013.01); *H05K 2201/10128* (2013.01); *H05K 2201/10151* (2013.01)

(58) Field of Classification Search
CPC .... G06F 1/1684; G06F 3/0412; G06F 3/0414; G06F 3/042; G06F 3/0421; G06F 2203/04109; H04M 1/026; H04M 1/0266; H04M 1/0277; H05K 1/181; H05K 1/189; H05K 5/0017; H05K 5/0086; H05K 1/147; H05K 5/03; H05K 2201/066; H05K 2201/10128; H05K 2201/10151; H01L 24/32; H01L 24/48; H01L 24/73; H01L 27/14618; H01L 27/14625; H01L 27/14636; H01L 27/323; H01L 27/3234; H01L 27/3276; H01L 2224/32225; H01L 224/48091; H01L 224/48106; H01L 2224/48227; H01L 2224/73265
See application file for complete search history.

(56) References Cited

U.S. PATENT DOCUMENTS

| | | | |
|---|---|---|---|
| 8,724,038 B2 | 5/2014 | Ganapathi et al. | |
| 8,743,082 B2 | 6/2014 | Ganapathi et al. | |
| 9,728,476 B2 | 8/2017 | Chung et al. | |
| 9,886,613 B2 | 2/2018 | Pi et al. | |
| 9,959,447 B2 | 5/2018 | Liu et al. | |
| 9,984,270 B2 | 5/2018 | Yousefpor et al. | |
| 9,984,947 B2 | 5/2018 | Chung et al. | |
| 9,986,072 B2 | 5/2018 | Lee et al. | |
| 10,083,335 B2 | 9/2018 | Zhang | |
| 10,185,866 B2 | 1/2019 | Goodelle et al. | |
| 10,229,316 B2 | 3/2019 | Wickboldt et al. | |
| 10,268,884 B2 | 4/2019 | Jones et al. | |
| 10,282,577 B2 * | 5/2019 | Lee | G06K 9/0002 |
| 10,360,430 B2 | 7/2019 | Zhang et al. | |
| 10,410,036 B2 | 9/2019 | He et al. | |
| 10,410,039 B2 | 9/2019 | Ling et al. | |
| 10,452,937 B2 | 10/2019 | Jin et al. | |
| 10,521,641 B2 | 12/2019 | Pi et al. | |
| 2004/0263752 A1* | 12/2004 | Kim | G02F 1/134363 349/141 |
| 2011/0061443 A1 | 3/2011 | Minami et al. | |
| 2011/0102567 A1 | 5/2011 | Erhart | |
| 2011/0102569 A1 | 5/2011 | Erhart | |
| 2011/0254108 A1* | 10/2011 | Gozzini | G06K 9/00053 257/415 |
| 2012/0090757 A1 | 4/2012 | Buchan et al. | |
| 2012/0092127 A1 | 4/2012 | Ganapathi et al. | |
| 2012/0092279 A1 | 4/2012 | Martin | |
| 2012/0092293 A1 | 4/2012 | Ganapathi et al. | |
| 2012/0092294 A1 | 4/2012 | Ganapathi et al. | |
| 2012/0092324 A1 | 4/2012 | Buchan et al. | |
| 2012/0092350 A1 | 4/2012 | Ganapathi et al. | |
| 2013/0176666 A1 | 7/2013 | Yamanaka et al. | |
| 2013/0193415 A1* | 8/2013 | Choi | H01L 51/52 257/40 |
| 2015/0036065 A1 | 2/2015 | Yousefpor et al. | |
| 2015/0310251 A1 | 10/2015 | Wyrwas et al. | |
| 2016/0004899 A1 | 1/2016 | Pi et al. | |
| 2016/0283772 A1* | 9/2016 | Nelson | G06K 9/00 |
| 2016/0358007 A1 | 12/2016 | Chung et al. | |
| 2017/0017824 A1 | 1/2017 | Smith et al. | |
| 2017/0061193 A1 | 3/2017 | Young et al. | |
| 2017/0083745 A1 | 3/2017 | Goodelle et al. | |
| 2017/0103251 A1 | 4/2017 | Liu et al. | |
| 2017/0220838 A1 | 8/2017 | He et al. | |
| 2017/0220844 A1 | 8/2017 | Jones et al. | |
| 2017/0270342 A1 | 9/2017 | He et al. | |
| 2017/0338163 A1 | 11/2017 | Chung et al. | |
| 2017/0372123 A1 | 12/2017 | Kim et al. | |
| 2018/0007181 A1 | 1/2018 | Lee et al. | |
| 2018/0046281 A1 | 2/2018 | Pi et al. | |
| 2018/0096187 A1 | 4/2018 | Kwon et al. | |
| 2018/0239941 A1* | 8/2018 | Mackey | G06K 9/0004 |
| 2018/0269121 A1 | 9/2018 | Chung et al. | |
| 2019/0034686 A1 | 1/2019 | Ling et al. | |
| 2019/0236329 A1 | 8/2019 | Zhang et al. | |
| 2020/0202097 A1 | 6/2020 | Kim et al. | |

FOREIGN PATENT DOCUMENTS

| | | |
|---|---|---|
| CN | 204461449 U | 7/2015 |
| CN | 105843329 A | 8/2016 |
| CN | 105868736 A | 8/2016 |
| CN | 106412164 A | 2/2017 |
| CN | 106527660 A | 3/2017 |
| CN | 107526953 A | 12/2017 |
| CN | 107918450 A | 4/2018 |
| EP | 0 767 991 | 11/2001 |
| EP | 3 258 408 A1 | 12/2017 |
| JP | 2013-142985 A | 7/2013 |
| JP | 5612218 | 11/2013 |
| KR | 10-1997-0704269 | 8/1997 |
| KR | 10-2014-0003423 A | 1/2014 |
| KR | 10-2015-0131944 A | 11/2015 |
| KR | 10-2016-0071352 | 6/2016 |
| KR | 10-2016-0071352 A | 6/2016 |
| KR | 10-2016-0090313 A | 7/2016 |
| KR | 10-2016-0096927 | 8/2016 |
| KR | 10-2016-0129874 | 11/2016 |
| KR | 10-2016-0129874 A | 11/2016 |
| KR | 10-2016-0143071 | 12/2016 |
| KR | 10-2016-0143071 A | 12/2016 |
| KR | 10-2017-0013731 A | 2/2017 |
| KR | 2017-0141522 A | 12/2017 |
| KR | 2018-0037799 A | 4/2018 |
| KR | 2018-0043307 | 4/2018 |
| KR | 10-2018-0089088 A | 8/2018 |
| KR | 2018-0100140 | 9/2018 |
| WO | 2016/205832 | 12/2016 |

(56) References Cited

FOREIGN PATENT DOCUMENTS

WO     WO 2016/205832     12/2016
WO     WO 2017/049318     3/2017

OTHER PUBLICATIONS

U.S. Appl. No. 15/949,253, filed Apr. 10, 2018; Kim et al.
Korean Office Action dated Jun. 14, 2019 for KR Application No. 10-2018-0123111.
CN Office Action dated Jun. 18, 2019 for CN Application No. 201810319469.X.
Search Report and Written Opinion dated Jul. 17, 2018 in counterpart International Patent Application No. PCT/KR2018/004215.
Notice of Allowance dated Aug. 28, 2018 in counterpart Korean Patent Application No. 10-2017-0046972 and English-language translation.
Extended Search Report dated Sep. 7, 2018 in counterpart European Patent Application No. 18166905.2.
Notice of Result of Preliminary Examination dated Apr. 5, 2018 in corresponding Korean Patent Application No. 10-2017-0046972 and English-language translation.
KR Notice of Allowance dated Jan. 13, 2020 for KR Application No. 10-2018-0123111.
EP Office Action dated Mar. 20, 2020 for EP Application No. 18166905.2.
European Office Action dated Sep. 14, 2020 for EP Application No. 18166905.2.

\* cited by examiner

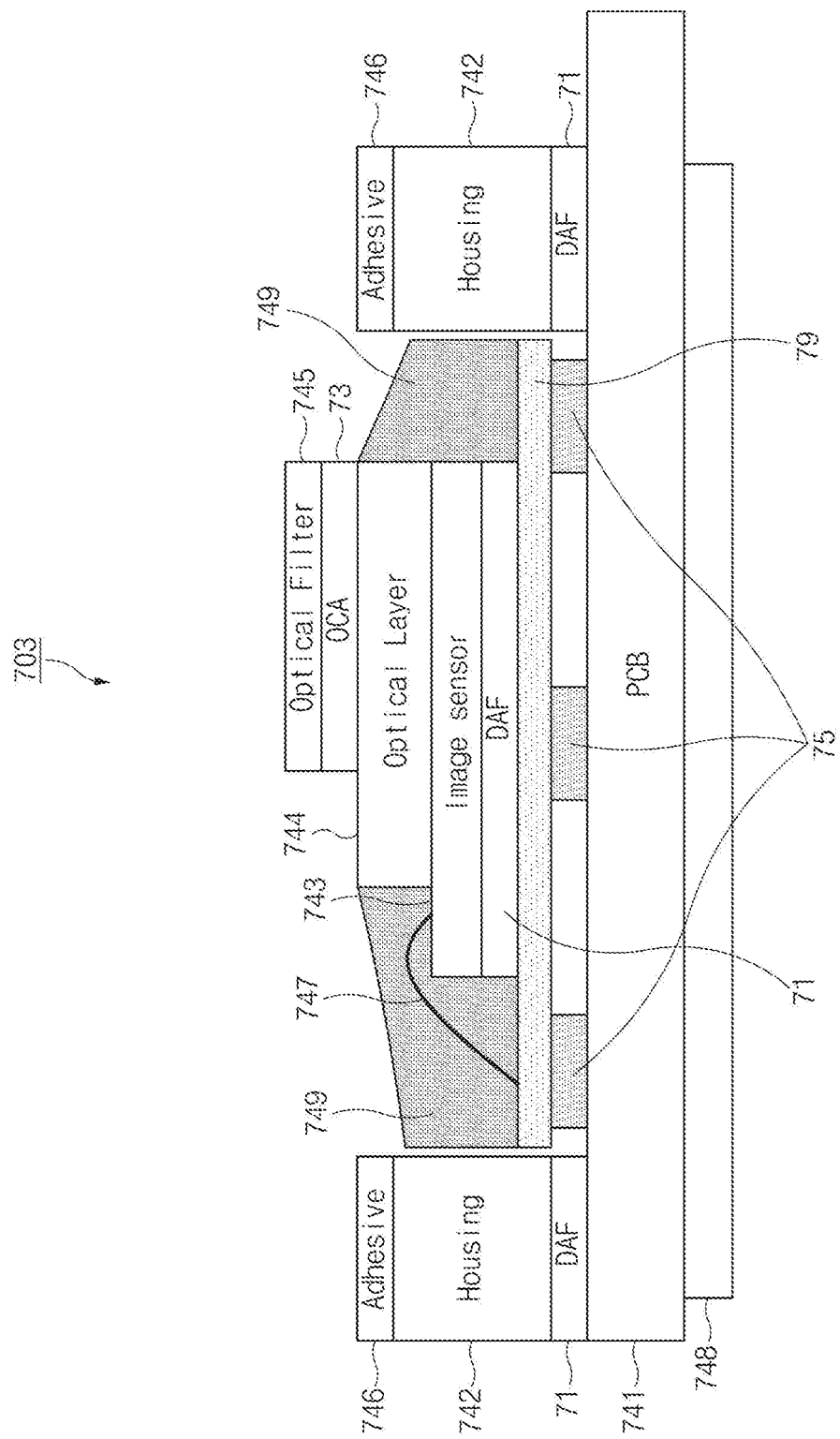

BIOMETRIC SENSOR AND DEVICE INCLUDING THE SAME

CROSS-REFERENCE TO RELATED APPLICATION

This application is a Continuation of U.S. application Ser. No. 16/808,474, filed Mar. 4, 2020, which is a Continuation of U.S. application Ser. No. 15/949,253, filed Apr. 10, 2018 (abandoned), which claims priority to KR 10-2017-0046972, filed Apr. 11, 2017, the entire contents of which are all hereby incorporated herein by reference in their entireties.

TECHNICAL FIELD

The present disclosure relates generally to a biometric sensor for detecting user's biometric information and a device including the same.

BACKGROUND

Recently, technologies for authenticating a user by using the user's biometric information (e.g., a fingerprint, an iris, or the like) obtained by a biometric sensor have been developed. Biometric sensors for fingerprint recognition may be classified into an optical type, an ultrasonic type, and a capacitive type, based on a method of obtaining fingerprint information.

In the case of an optical sensor, it is necessary to maintain a constant distance between the sensor and a display and to prevent and/or reduce infiltration of foreign matter (e.g., dust) between the sensor and the display. However, due to external shocks or aging in the process of using an electronic device, the distance between the display and the sensor may vary, or foreign matter may infiltrate between the display and the sensor, and therefore the performance of the sensor may be degraded.

SUMMARY

Example aspects of the present disclosure address at least the above-mentioned problems and/or disadvantages and provide at least the advantages described below. Accordingly, an example aspect of the present disclosure is to provide a biometric sensor and a device including the same, in which the biometric sensor has a structure for stably maintaining the distance between a display and a sensor and preventing and/or reducing infiltration of foreign matter between the display and the sensor.

In accordance with an example aspect of the present disclosure, a sensor device includes a printed circuit board, a biometric sensor disposed on the printed circuit board, and a housing disposed on the printed circuit board and including an opening in which the biometric sensor is accommodated.

In accordance with another example aspect of the present disclosure, a display device includes a display panel, a cover glass disposed on the display panel, and a biometric sensor device disposed below the display panel. The biometric sensor device includes a printed circuit board, a biometric sensor disposed on the printed circuit board, and a housing in which an opening is formed. The biometric sensor is accommodated in the opening of the housing and is attached to a surface of the display panel through the housing.

In accordance with another example aspect of the present disclosure, an electronic device includes a display panel, a cover glass disposed on the display panel, a biometric sensor device disposed below the display panel, and a processor electrically connected with the display panel and the biometric sensor device. The processor configured to obtain fingerprint information using the biometric sensor device. The biometric sensor device includes a printed circuit board, a biometric sensor disposed on the printed circuit board, and a housing in which an opening is formed. The biometric sensor is accommodated in the opening of the housing and is attached to a surface of the display panel through the housing.

According to various example embodiments of the present disclosure, by stably maintaining the distance between a display and a sensor and preventing and/or reducing infiltration of foreign matter between the display and the sensor, it is possible to prevent and/or reduce performance degradation of the sensor.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and attendant advantages of the present disclosure will be more apparent and readily appreciated from the following detailed description, taken in conjunction with the accompanying drawings, in which like reference numerals refer to like elements, and wherein:

FIG. 7B is a sectional view illustrating an example biometric sensor module according to an example embodiment of the present disclosure;

DETAILED DESCRIPTION

Hereinafter, various example embodiments of the present disclosure will be described with reference to the accompanying drawings. However, those of ordinary skill in the art will recognize that modifications, equivalents, and/or alternatives on the various embodiments described herein can be variously made without departing from the scope and spirit of the present disclosure. With regard to description of drawings, similar elements may be marked by similar reference numbers.

Figure 1:
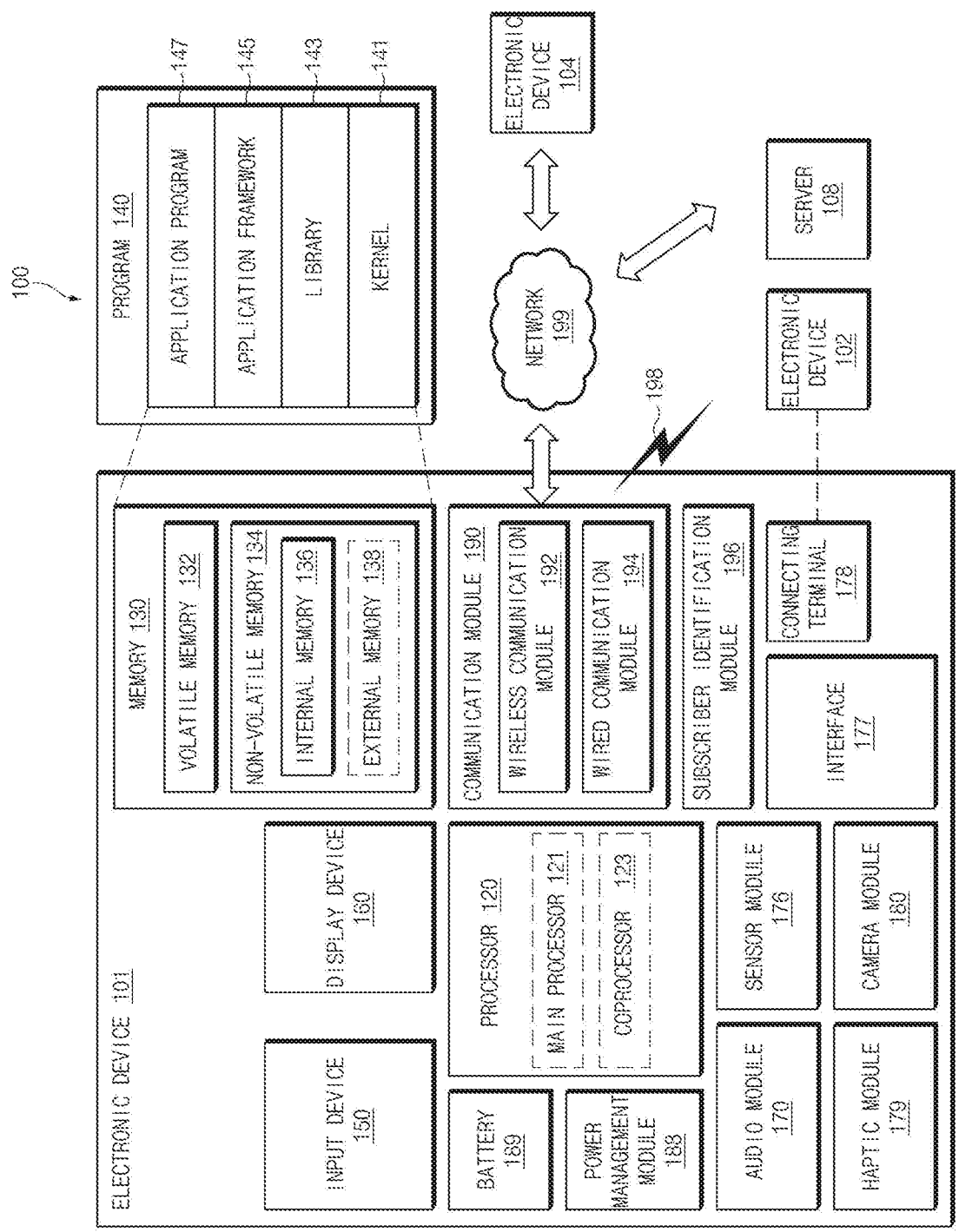
FIG. 1 is a block diagram illustrating an example electronic device in a network environment according to various example embodiments of the present disclosure.

FIG. 1 is a block diagram illustrating an example electronic device in a network environment according to various example embodiments of the present disclosure.

Referring to FIG. 1, in a network environment 100, an electronic device 101 may communicate with an electronic device 102 through a short-range wireless communication 198, or may communicate with an electronic device 104 or a server 108 through a network 199. According to an embodiment, the electronic device 101 may communicate with the electronic device 104 through the server 108. According to an embodiment, the electronic device 101 may include a processor (e.g., including processing circuitry) 120, a memory 130, an input device 150 (e.g., including input circuitry, such as, for example, and without limitation, a microphone or a mouse), a display device 160, an audio module (e.g., including audio circuitry) 170, a sensor module (e.g., including sensing circuitry and/or a sensor) 176, an interface (e.g., including interface circuitry) 177, a haptic module (e.g., including haptic circuitry) 179, a camera module (e.g., including image capturing circuitry) 180, a power management module 188, a battery 189, a communication module (e.g., including communication circuitry) 190, and a subscriber identification module 196. In some embodiments, the electronic device 101 may not include at least one (e.g., the display device 160 or the camera module 180) of the aforementioned elements, or may further include other elements. In some embodiments, some of the elements may be integrated, as in the case of the sensor module 176 (e.g., a fingerprint sensor, an iris sensor, or an illuminance sensor) embedded in the display device 160 (e.g., a display).

The processor 120 may include various processing circuitry and drive, for example, an operating system or an application program to control at least one other element (e.g., a hardware or software element) of the electronic device 101 that is connected to the processor 120, and may process and compute a variety of data. The processor 120 may load instructions or data received from other elements (e.g., the sensor module 176 or the communication module 190) into a volatile memory 132, may process the loaded instructions or data, and may store result data in a non-volatile memory 134. The processor 120 may include various processing circuitry, such as, for example, and without limitation, one or more of a dedicated processor, a central processing unit, an application processor, a graphic processing unit, an image signal processor, a sensor hub processor, and a communication processor, or the like. According to an embodiment, the processor 120 may include, for example, and without limitation, a main processor 121 (e.g., a central processing unit or an application processor, or the like) and a coprocessor 123 (e.g., a graphic processing unit, an image signal processor, a sensor hub processor, or a communication processor, or the like) that operates independently of the main processor 121 and additionally or alternatively, uses less power than the main processor 121 or specializes in a specified function. In this case, the coprocessor 123 may control at least a part of functions or states relating to at least one (e.g., the display device 160, the sensor module 176, or the communication module 190) of the elements 130 to 196 of the electronic device 101, for example, instead of the main processor 121 while the main processor 121 is in an inactive (e.g., sleep) state or along with the main processor 121 while the main processor 121 is in an active (e.g., application execution) state. According to an embodiment, the coprocessor 123 (e.g., an image signal processor or a communication processor) may be implemented as a part of other functionally related elements (e.g., the camera module 180 or the communication module 190). According to an embodiment, the processor 120 may be implemented with a system on chip (SoC) or a system in package (SiP).

The memory 130 may store a variety of data (e.g., a software element (e.g., a program 140) and input or output data for instructions relating to the software element) used by at least one element (e.g., the processor 120 or the sensor module 176) of the electronic device 101. The memory 130 may include the volatile memory 132 and/or the non-volatile memory 134. The volatile memory 132 may be configured with, for example, a random access memory (RAM) (e.g., a DRAM, an SRAM, or an SDRAM). The non-volatile memory 134 may be configured with, for example, a one-time programmable read-only memory (OTPROM), a programmable read-only memory (PROM), an erasable programmable read-only memory (EPROM), an electrically erasable programmable read-only memory (EEPROM), a mask ROM, a flash ROM, a flash memory, a hard disk drive, or a solid state drive (SSD). Furthermore, depending on the type of connection to the electronic device 101, the non-volatile memory 134 may be configured with an internal memory 136 disposed in the electronic device 101 and/or an external memory 138 of a stand-alone type that is intended to be connected to the electronic device 101 only when necessary. The external memory 138 may include, for example, a hard disk, a floppy disk, a magnetic medium (e.g., a magnetic tape), an optical recording medium (e.g., a compact disc read only memory (CD-ROM), a digital versatile disc (DVD), or a magneto-optical medium (e.g., a floptical disk)), a flash drive (e.g., compact flash (CF), secure digital (SD), micro secure digital (Micro-SD), mini secure digital (Mini-SD), extreme digital (xD), a multimedia card (MMC), or a memory stick). The external memory 138 may be operatively or physically connected with the electronic device 101 through wired connection (e.g., a universal serial bus (USB)) or wireless connection (e.g., Bluetooth).

The program 140, which is a software element stored in the memory 130, may include, for example, a kernel 141, a library 143, an application framework 145, or an application program (interchangeably referred to as "an application") 147.

The input device 150 may include various input circuitry and receive instructions or data to be used for an element (e.g., the processor 120) of the electronic device 101 from outside (e.g., a user) of the electronic device 101 and may include various input circuitry, such as, for example, and without limitation, one or more of a microphone, a mouse, or a keyboard, or the like. According to an embodiment, the keyboard may include a physical keyboard or a virtual keyboard displayed through the display device 160.

The display device 160 may visually provide information to a user of the electronic device 101 and may include, for example, a display, a hologram device, or a projector and a control circuit for controlling the corresponding device. The display may include, for example, a liquid crystal display (LCD), a light-emitting diode (LED) display, an organic light-emitting diode (OLED) display, a microelectromechanical systems (MEMS) display, or an electronic paper display, or the like, but is not limited thereto. The display, according to an embodiment, may be implemented to be flexible, transparent, or wearable on a part of a human body. According to an embodiment, the display may include touch circuitry for detecting a user's touch, gesture, proximity, or hovering input or a pressure sensor (interchangeably referred to as a force sensor) for measuring the strength of touch pressure. The touch circuitry or the pressure sensor may be implemented integrally with the display or may be implemented with one or more sensors separate from the display. The hologram device may show a three-dimensional image in the air by using a light interference phenomenon. The projector may project light onto a screen located inside or outside the electronic device 101 to display an image.

The audio module 170 may include various audio circuitry and bilaterally convert between a sound and an electric signal. According to an embodiment, the audio module 170 may obtain a sound through an input device 150 (e.g., a microphone) or may output a sound through a sound output device (not illustrated) (e.g., a speaker or a receiver) included in the electronic device 101 or an external electronic device (e.g., the electronic device 102 (e.g., a speaker or headphones)) connected with the electronic device 101 in a wired or wireless manner.

The sensor module 176 may include various sensing circuitry/sensors that measure or detect an operating status (e.g., power or temperature) inside the electronic device 101 or an environmental status (e.g., altitude, humidity, or brightness) outside the electronic device 101 to generate an electrical signal or a data value that corresponds to the measured or detected status information. The sensor module 176 may include, for example, and without limitation, a gesture sensor, a gyro sensor, a barometric pressure sensor, a magnetic sensor, an acceleration sensor, a grip sensor, a proximity sensor, a color sensor (e.g., a red, green, blue (RGB) sensor), an infrared (IR) sensor, a biometric sensor (e.g., an iris sensor, a fingerprint sensor, heartbeat rate monitoring (HRM), an e-nose sensor, an electromyography (EMG) sensor, an electroencephalogram (EEG) sensor, or an electrocardiogram (ECG) sensor), a temperature sensor, a humidity sensor, an illuminance sensor, or a ultra violet (UV) sensor, or the like. The sensor module 176 may further include a control circuit for controlling one or more sensors included therein. In some embodiments, the sensor module 176 may be controlled by the main processor 121 (e.g., an application processor) or the coprocessor 123 (e.g., a sensor hub processor) that operates independently of the main processor 121. In this case, for example, while the main processor 121 (e.g., an application processor) is in a sleep state, at least a part of operations or states of the sensor module 176 may be controlled by operating a separate low-power processor without waking up the main processor 121 (e.g., an application processor).

The interface 177 may include various interface circuitry and provide a means for connecting with an external electronic device (e.g., the electronic device 102) based on a specified standard. According to an embodiment, the interface 177 may include various interface circuitry, such as, for example, and without limitation, a high definition multimedia interface (HDMI), a universal serial bus (USB) interface, an optical interface, a recommended standard232 (RS-232) interface, a D-subminiature (D-sub) interface, a mobile high-definition link (MHL) interface, an SD card interface, a multi-media card (MMC) interface, or an audio interface, or the like.

A connecting terminal 178 may physically connect the electronic device 101 and an external electronic device (e.g., the electronic device 102). According to an embodiment, the connecting terminal 178 may include, for example, an HDMI connector, a USB connector, an SD card, an MMC connector, or an audio connector (e.g., a headphone connector), or the like, but is not limited thereto.

The haptic module 179 may include various haptic circuitry and convert an electrical signal into mechanical stimulation (e.g., vibration or motion) or electrical stimulation that a user is able to recognize through a tactile sensation or a kinesthetic sensation. The haptic module 179 may include, for example, and without limitation, a motor, a piezoelectric element, or an electrical stimulation device, or the like.

The camera module 180 may include various image capturing circuitry and take a still image and a video. According to an embodiment, the camera module 180 may include, for example, and without limitation, one or more lenses (e.g., a wide-angle lens and a telephoto lens, or a front lens and a rear lens), an image sensor, an image signal processor, or a flash (e.g., a light-emitting diode, a xenon lamp, or the like), or the like.

The power management module 188 may manage power supplied to the electronic device 101 and may be configured as, for example, at least a part of a power management integrated circuit (PMIC).

The battery 189 may supply power to at least one element of the electronic device 101 and may include, for example, a non-rechargeable primary cell, or a rechargeable secondary cell or a fuel cell.

The communication module 190 may include various communication circuitry and establish a wired or wireless communication channel between the electronic device 101 and an external electronic device (e.g., the electronic device 102, the electronic device 104, or the server 108) and may perform communication through the established communication channel. According to an embodiment, the communication module 190 may include, for example, and without limitation, a wireless communication module 192 and a wired communication module 194, or the like, and may communicate with an external electronic device (e.g., the first external electronic device 102, the second external electronic device 104, or the server 108) through the first network 198 (e.g., a short-range communication network, such as Bluetooth, Wi-Fi direct, or infrared data association (IrDA)) or the second network 199 (e.g., a long-range communication network, such as a cellular network, Internet, or a computer network (e.g., LAN or WAN)) by using the corresponding communication module.

The wireless communication module 192 may support, for example, cellular communication, short-range wireless communication, or global navigation satellite system (GNSS) communication. The cellular communication may include, for example, long-term evolution (LTE), LTE advanced (LTE-A), code division multiple access (CDMA), wideband CDMA (WCDMA), universal mobile telecommunications system (UMTS), wireless broadband (WiBro), or global system for mobile communications (GSM). The short-range wireless communication may include, for example, wireless fidelity (Wi-Fi), Wi-Fi direct, light fidelity (LiFi), Bluetooth, Bluetooth low energy (BLE), Zigbee, near field communication (NFC), magnetic secure transmission (MST), radio frequency (RF), or a body area network (BAN). The GNSS may include, for example, a global positioning system (GPS), a global navigation satellite system (Glonass), a Beidou navigation satellite system (hereinafter referred to as "Beidou"), or the European global satellite-based navigation system (hereinafter referred to as "Galileo"). Hereinafter, in this disclosure, "GPS" may be used interchangeably with "GNSS".

According to an embodiment, the wireless communication module 192 may identify and authenticate the electronic device 101 in a communication network using, for example, the subscriber identification module (e.g., a SIM card) 196 in the case where the wireless communication module 192 supports cellular communication. According to an embodiment, the wireless communication module 192 may include, for example, and without limitation, a communication processor (CP) that operates independently of the processor 120 (e.g., an application processor (AP)), or the like. In this case, the communication processor may perform at least a part of functions relating to at least one of the elements 130 to 196 of the electronic device 101, for example, instead of the processor 120 while the processor 120 is in an inactive (e.g., sleep) state or along with the processor 120 while the processor 120 is in an active state. According to an embodiment, the wireless communication module 192 may be configured with a plurality of communication modules supporting only the corresponding communication method, among a cellular communication module, a short-range wireless communication module, and a GNSS communication module.

The wired communication module 194 may include, for example, a communication processor supporting a wired communication method, such as a local area network (LAN), power line communication, or a plain old telephone service (POTS).

Some of the elements 120 to 196 may be connected together through an inter-peripheral communication method (e.g., a bus, a general purpose input/output (GPIO), a serial peripheral interface (SPI), or a mobile industry processor interface (MIPI)) to exchange signals (e.g., instructions or data) with one another.

According to an embodiment, the instructions or data may be transmitted or received between the electronic device 101 and the second external electronic device 104 through the server 108 connected to the second network 199. The first and second external electronic devices 102 and 104 may each be of a type that is the same as or different from that of the electronic device 101. According to an embodiment, all or a part of operations that the electronic device 101 will perform may be executed by another external electronic device or a plurality of external electronic devices (e.g., the electronic device 102 or 104 or the server 108). According to an embodiment, in the case where the electronic device 101 has to perform any function or service automatically or in response to a request, the electronic device 101 may request at least some functions associated with the function or service from another device (e.g., the electronic device 102 or 104 or the server 108), instead of or in addition to executing the function or service by itself. The other electronic device (e.g., the electronic device 102 or 104 or the server 108), which has received the request, may execute the requested functions or additional functions and may transmit the execution result to the electronic device 101. The electronic device 101 may provide the requested function or service using the received result or may additionally process the received result to provide the requested function or service. To this end, for example, cloud computing, distributed computing, or client-server computing may be used.

Figure 2:
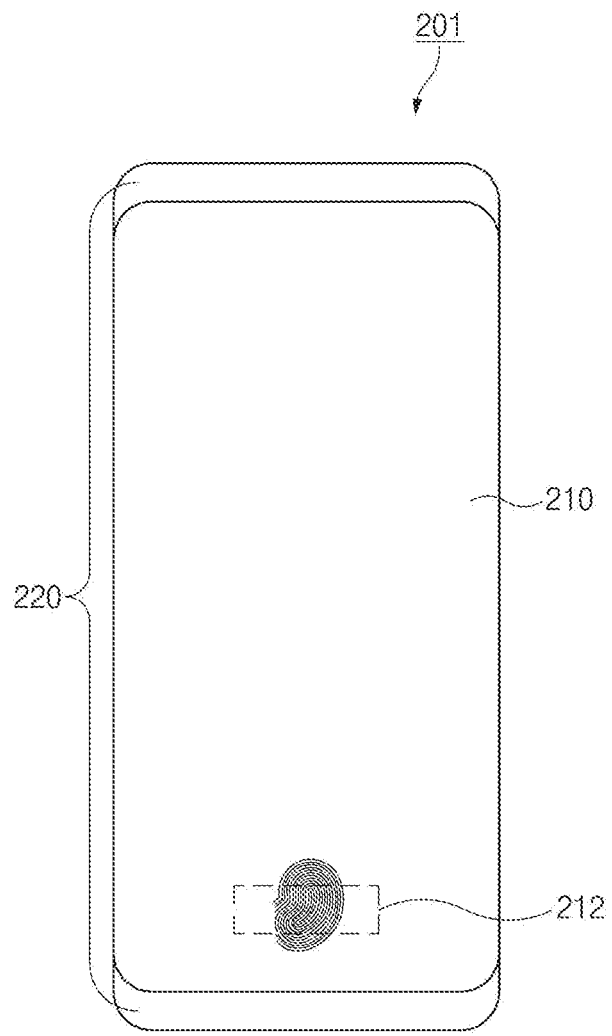
FIG. 2 is a diagram illustrating an example external appearance of an electronic device according to an example embodiment of the present disclosure.

FIG. 2 is a diagram illustrating an example external appearance of an electronic device according to an example embodiment of the present disclosure.

Referring to FIG. 2, according to an embodiment, a display (or a display panel) 210 and a housing 220 may be exposed on a front surface of an electronic device 201. According to an embodiment, the electronic device 201 may include a variety of non-illustrated hardware modules. For example, the display 210 may have, on a rear surface thereof, a pressure sensor for sensing the strength (or pressure) of a user's touch input and/or a biometric sensor for detecting the user's fingerprint.

According to an embodiment, the electronic device 201 may detect the user's fingerprint through a second area 212 of the display 210. To this end, a biometric sensor for detecting the fingerprint may be disposed on a rear surface of the second area 212 of the display 210.

According to various embodiments of the present disclosure, the biometric sensor may provide a sensor package structure that is capable of maintaining an appropriate distance from the display 210 to accurately obtain the user's fingerprint information and preventing and/or reducing performance degradation caused by infiltration of foreign matter outside the biometric sensor even though disposed on the rear surface of the display 210.

The electronic device 201 in FIG. 2 is merely illustrative, and the present disclosure is not limited thereto. For example, a receiver, a camera module, an iris sensor, or other biometric sensors may be disposed on the rear surface of the display 210.

Figure 3:
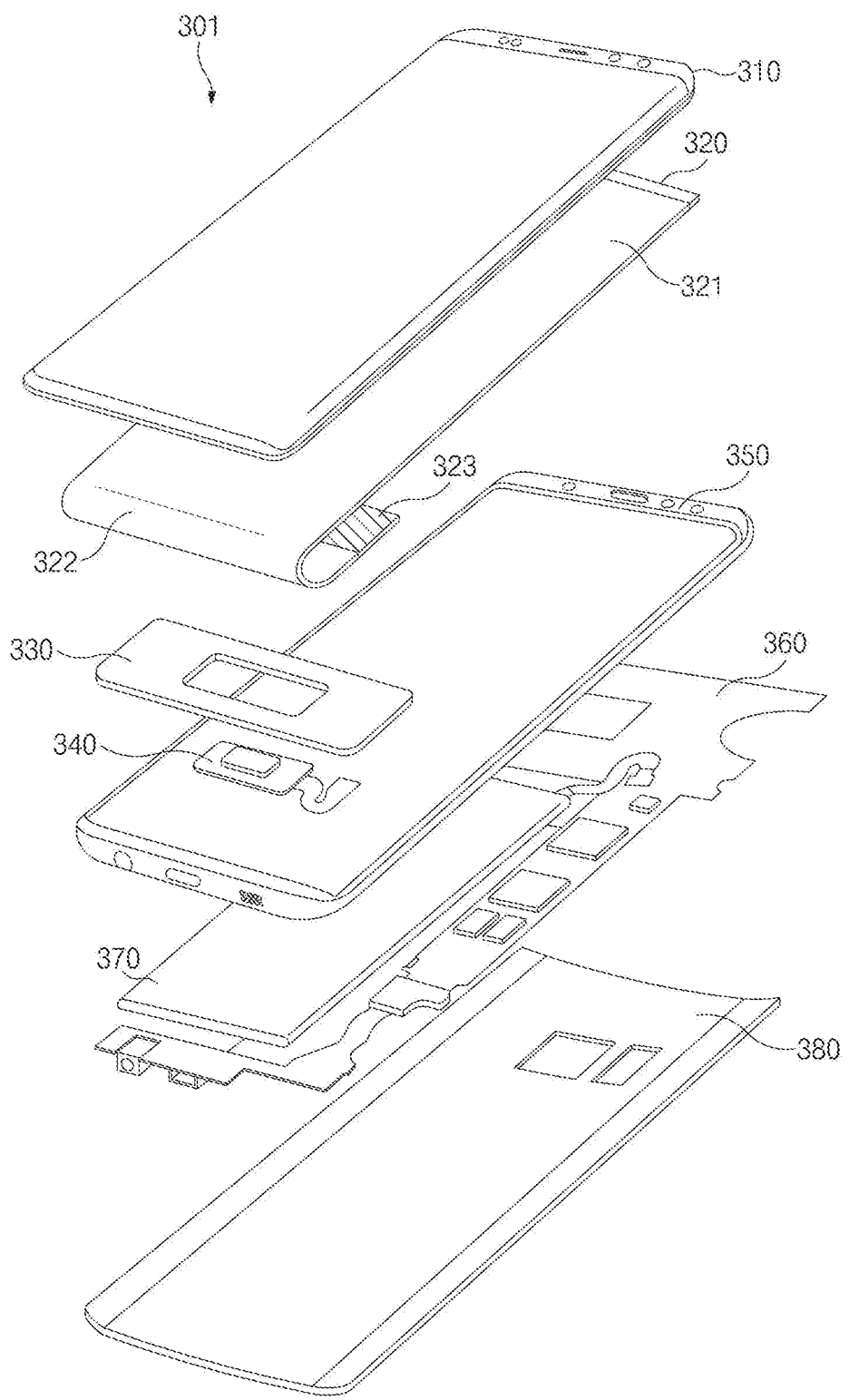
FIG. 3 is an exploded perspective view illustrating an example electronic device according to an example embodiment of the present disclosure.

FIG. 3 is an exploded perspective view illustrating an example electronic device according to an example embodiment of the present disclosure.

Referring to FIG. 3, an electronic device 301 (e.g., the electronic device 201) according to an embodiment may include a cover glass 310, a display (or a display panel) 320 (e.g., the display 210), a pressure sensor 330, a biometric sensor module 340 (e.g., a biometric sensor circuit, a biometric sensor device, or a biometric sensor means, for example, and without limitation, a fingerprint sensor), a housing 350 (e.g., the housing 220), a printed circuit board 360, a battery 370, and a back cover 380. According to various embodiments, the electronic device 301 may not include some of the elements illustrated in FIG. 3 and may further include elements not being illustrated in FIG. 3.

The cover glass 310 may pass light generated by the display 320. Furthermore, a user may perform a touch (including contact using an electronic pen) by touching the cover glass 310 with a part (e.g., a finger) of his/her body. The cover glass 310 may comprise, for example, reinforced glass, reinforced plastic, a flexible polymer material, or the like, but is not limited thereto, to protect the display 320 and elements included in the electronic device 301 from, for example, external shocks. According to various embodiments, the cover glass 310 may also be referred to as a glass window.

The display 320 may be disposed and/or coupled below the cover glass 310 and may be exposed through at least a portion of the cover glass 310. The display 320 may output contents (e.g., text, an image, a video, an icon, a widget, a symbol, or the like) or may receive a touch input or an electronic pen input from the user.

According to an embodiment, the display 320 may include a display panel, a touch sensor, and/or an electronic pen sensor. The display panel may include, for example, a liquid crystal display (LCD) panel, a light-emitting diode (LED) display panel, an organic light-emitting diode (OLED) display panel, a microelectromechanical systems (MEMS) display panel, or an electronic paper display panel, or the like, but is not limited thereto. The touch sensor may, for example, include a capacitive touch panel, a pressure-sensitive touch panel, a resistive touch panel, an infrared touch panel, or an ultrasonic touch panel, or the like, but is not limited thereto. The touch sensor may be inserted into the display panel (an add-on touch panel), may be directly formed on the display panel (an on-cell touch panel), or may be included in the display panel (an in-cell touch panel). The electronic pen sensor (e.g., a digitizer) may detect a touch input, a gesture input, a hovering input, or the like from an electronic pen.

According to an embodiment, the display 320 may include a planar area 321 and a bending area 322 extending from one side (e.g., an upper side, a lower side, a left side, or a right side) of the planar area 321. Pixels (e.g., OLEDs) of the display panel, a conductive pattern of the touch sensor, and/or a conductive pattern of the electronic pen sensor may be disposed in the planar area 321. The bending area 322 may be electrically connected with an FPCB 323 on a rear surface of the display 320 through various conductive patterns (interconnection wires).

According to an embodiment, a portion of the bending area 322 may be folded toward a rear surface of the planar area 321. According to various embodiments, interconnection wiring of the FPCB 323 may be electrically connected with the printed circuit board 360 through a specified connector. According to various embodiments, the bending area 322 may have pixels disposed therein for displaying various pieces of information, similarly to the planar area 321, depending on the design of the electronic device 301.

The pressure sensor 330 may be disposed and/or coupled below the display 320. For example, the pressure sensor 330 may be disposed between the planar area 321 of the display 320 and the FPCB 323. The pressure sensor 330 may detect or sense external pressure (or force) exerted on the cover glass 310 by, for example, the user's finger. According to an embodiment, the pressure sensor 330 may include a plurality of electrodes and dielectric layers. For example, the pressure sensor 330 may detect touch pressure on the basis of a variation in electrostatic capacitance between a first electrode and a second electrode, which is caused by the user's touch.

The biometric sensor module 340 (e.g., a fingerprint sensor, or the like) may be disposed and/or coupled below the display 320. For example, the biometric sensor module 340 may be attached to the planar area 321 of the display 320. According to an embodiment, the pressure sensor 330 may include a sensor mounting area (or hole or opening) formed through a front surface and a rear surface thereof for placement of the biometric sensor module 340. The biometric sensor module 340 may be inserted into the sensor mounting area of the pressure sensor 330 and may be arranged side by side with the pressure sensor 330.

The biometric sensor module 340 may sense the user's biometric information (e.g., fingerprint information, or the like). The biometric sensor module 340 may include, for example, an optical biometric sensor. For example, the biometric sensor module 340 may capture the user's fingerprint image using an embedded image sensor (e.g., a complementary metal oxide semiconductor (CMOS) image sensor or a charge coupled device (CCD) image sensor). Unique fingerprint minutiae may be extracted from the fingerprint image and may be compared with fingerprint minutiae registered in advance to authenticate the user.

The biometric sensor module 340 may obtain fingerprint information by receiving at least a portion of light output from at least one light-emitting element included in the display 320, for example, by receiving light reflected by the user's finger. According to various embodiments, the biometric sensor module 340 may include a light-emitting part and a light-receiving part and may obtain the fingerprint information by outputting light using the light-emitting part and receiving the light reflected by an external object (e.g., a finger) through the light-receiving part.

The housing 350 may form at least a portion of the external appearance of the electronic device 301 and may accommodate elements included in the electronic device 301. For example, the housing 350 may form a lateral side (e.g., an upper side, a lower side, a left side, and/or a right side) of the electronic device 301. According to various embodiments, the housing 350 may include a plurality of housings. The housing 350 may also be referred to as a rear case or a rear plate. According to an embodiment, at least a part of sides of the housing 350 may include metal to function as an antenna structure.

According to an embodiment, the housing 350 may include a bracket. The bracket may be include, for example, a magnesium alloy and may be disposed below the display 320 and above the printed circuit board 360. The bracket may be coupled with the display 320 and the printed circuit board 360 to physically support the display 320 and the printed circuit board 360.

According to an embodiment, the printed circuit board 360 may be disposed below (or above) the housing 350. Various types of electronic components, elements, and printed circuits (e.g., a processor, a memory, a communication circuit, and the like) of the electronic device 301 may be mounted or arranged on the printed circuit board 360. According to various embodiments, the printed circuit board 360 may be referred to as a main board or a printed board assembly (PBA), or may be simply referred to as a PCB. The printed circuit board 360 may include, for example, a main printed circuit board and a sub-printed circuit board. According to an embodiment, the main printed circuit board and the sub-printed circuit board may be electrically connected together through a specified connector or specified interconnection wiring. The printed circuit board 360 may be implemented with, for example, a rigid printed circuit board (rigid PCB) and/or a flexible printed circuit board (FPCB).

The battery 370 may bilaterally convert between chemical energy and electrical energy. For example, the battery 370 may convert chemical energy into electrical energy and may supply the electrical energy to the display 320, the pressure sensor 330, the biometric sensor module 340, and various elements or modules connected to the printed circuit board 360. According to an embodiment, the printed circuit board 360 may include a power management module (e.g., a power management integrated circuit (PMIC)) for managing charge/discharge of the battery 370.

The back cover 380 may be coupled to a rear surface of the electronic device 301. The back cover 380 may include reinforced glass, a plastic injection-molded material, and/or metal, or the like. According to various embodiments, the back cover 380 may be implemented integrally with the housing 350 or may be implemented to be detachable by the user.

Figure 4A:
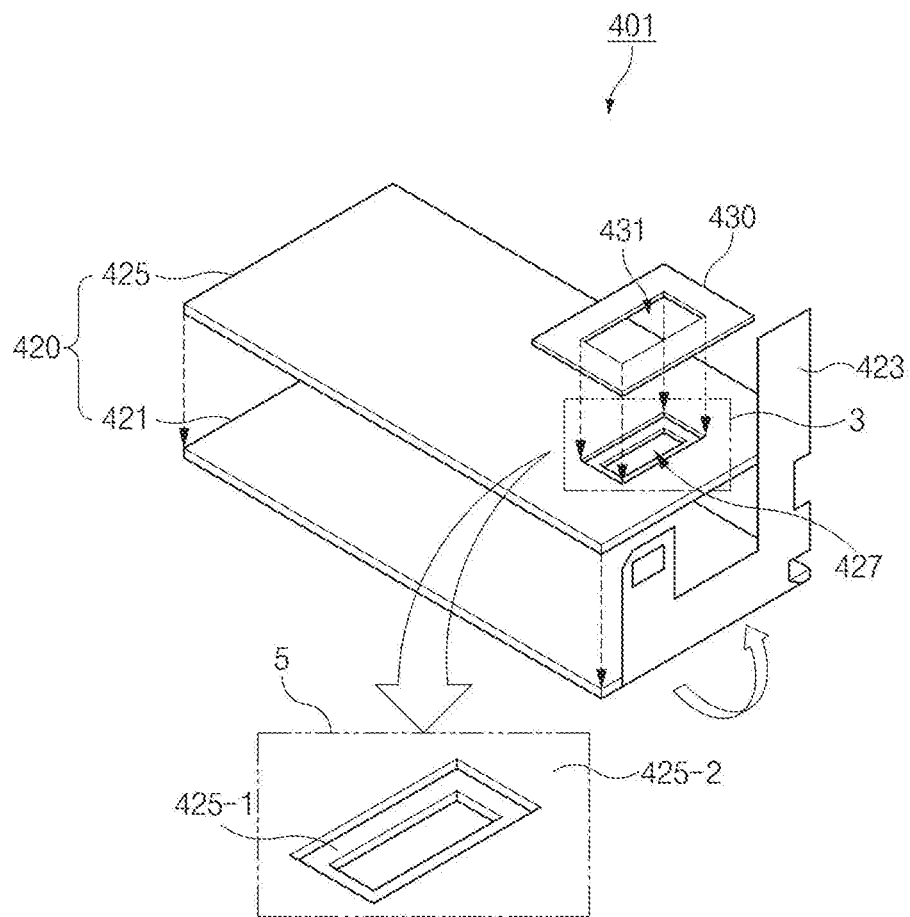
FIGS. 4A and 4B are diagrams illustrating an example coupling structure of an electronic device according to an example embodiment of the present disclosure.
Figure 4B:
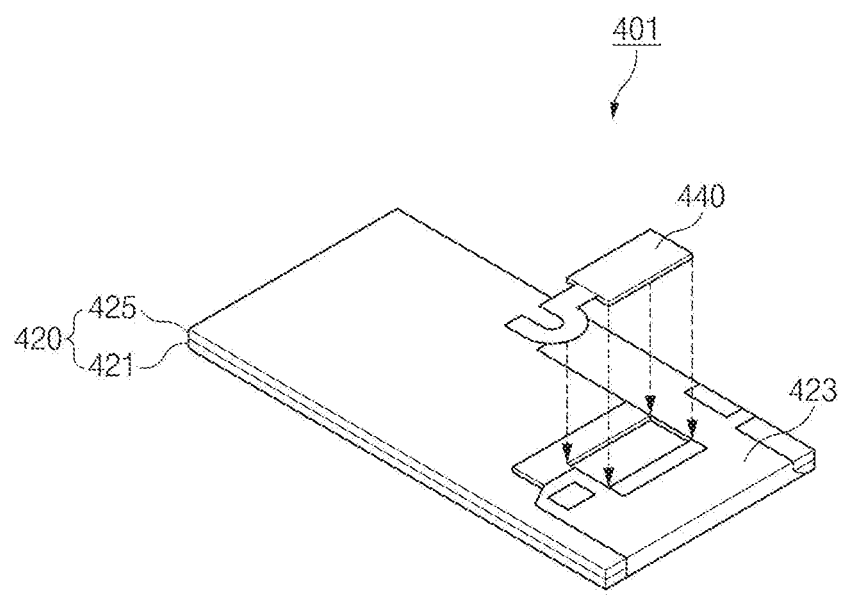

FIGS. 4A and 4B are diagrams illustrating example coupling structures of an electronic device according to an example embodiment of the present disclosure.

FIGS. 4A and 4B are rear perspective views of an electronic device 401.

Referring to FIG. 4A, the electronic device 401 (e.g., the electronic device 301 of FIG. 3) according to an embodiment may include a display (or a display panel) 420 (e.g., the display 320 of FIG. 3) and a pressure sensor 430 (e.g., the pressure sensor 330 of FIG. 3). Referring to FIG. 4B, the electronic device 401 (e.g., the electronic device 301 of FIG. 3) according to an embodiment may further include a biometric sensor module 440 (e.g., the biometric sensor module 340 of FIG. 3).

According to an embodiment, the display 420 may include a panel layer 421 and a layer 425. According to an embodiment, the panel layer 421 may include at least one light-emitting element. According to an embodiment, the panel layer 421 may include at least one hole or gap through which light in a specific wavelength range passes. For example, the panel layer 421 may include at least one gap between a plurality of pixels and interconnection wires. Reflective light reflected by a user's finger after output from the panel layer 421 may reach the biometric sensor module 440 through the at least one gap included in the panel layer 421. According to an embodiment, the layer 425 may be disposed to face a rear surface of the panel layer 421. According to an embodiment, the layer 425 may include a sensor mounting area 427 for accommodating the biometric sensor module 440 (e.g., the biometric sensor module 340 of FIG. 3). The sensor mounting area 427 may be formed through a front surface and a rear surface of the layer 425 such that the biometric sensor module 440 inserted into the sensor mounting area 427 faces an area of the panel layer 421.

Referring to an image 5 obtained by magnifying an area 3 of the layer 425, the layer 425 may include a first layer 425-1 and a second layer 425-2. According to an embodiment, through-holes (or openings) formed through the first and second layers 425-1 and 425-2 may have different sizes, respectively. For example, the through-hole of the second layer 425-2 may have a larger area than the through-hole of the first layer 425-1.

According to an embodiment, the display 420 may include a printed circuit board 423 (e.g., the FPCB 323 of FIG. 3) on which a display IC and/or a touch sensor IC is disposed. According to an embodiment, the printed circuit board 423 may extend from one side (e.g., a lower side) of the panel layer 421 and may be electrically connected with the panel layer 421.

According to an embodiment, the pressure sensor 430 may include a sensor mounting area 431 for accommodating the biometric sensor module 440. The sensor mounting area 431 of the pressure sensor 430 may have the shape of an opening formed through a front surface and a rear surface of the pressure sensor 430. Accordingly, the biometric sensor module 440 may be disposed to face an area of the panel layer 421 through the sensor mounting area 431 of the pressure sensor 430. According to an embodiment, the sensor mounting area 431 of the pressure sensor 430 may have an area larger than or equal to that of the sensor mounting area 427 of the layer 425.

According to an embodiment, the printed circuit board 423 may be folded toward the rear surface of the layer 425 and attached to the layer 425 and the pressure sensor 430 to overlap at least a portion of the layer 425 and the pressure sensor 430.

Referring to FIG. 4B, the biometric sensor module 440 (e.g., the biometric sensor module 340 of FIG. 3) may be attached to a rear surface of the display 420. For example, one surface of the biometric sensor module 440 may be attached to the first layer 425-1 of the layer 425 after passing through the pressure sensor 430 and the second layer 425-2 of the layer 425.

Figure 5:
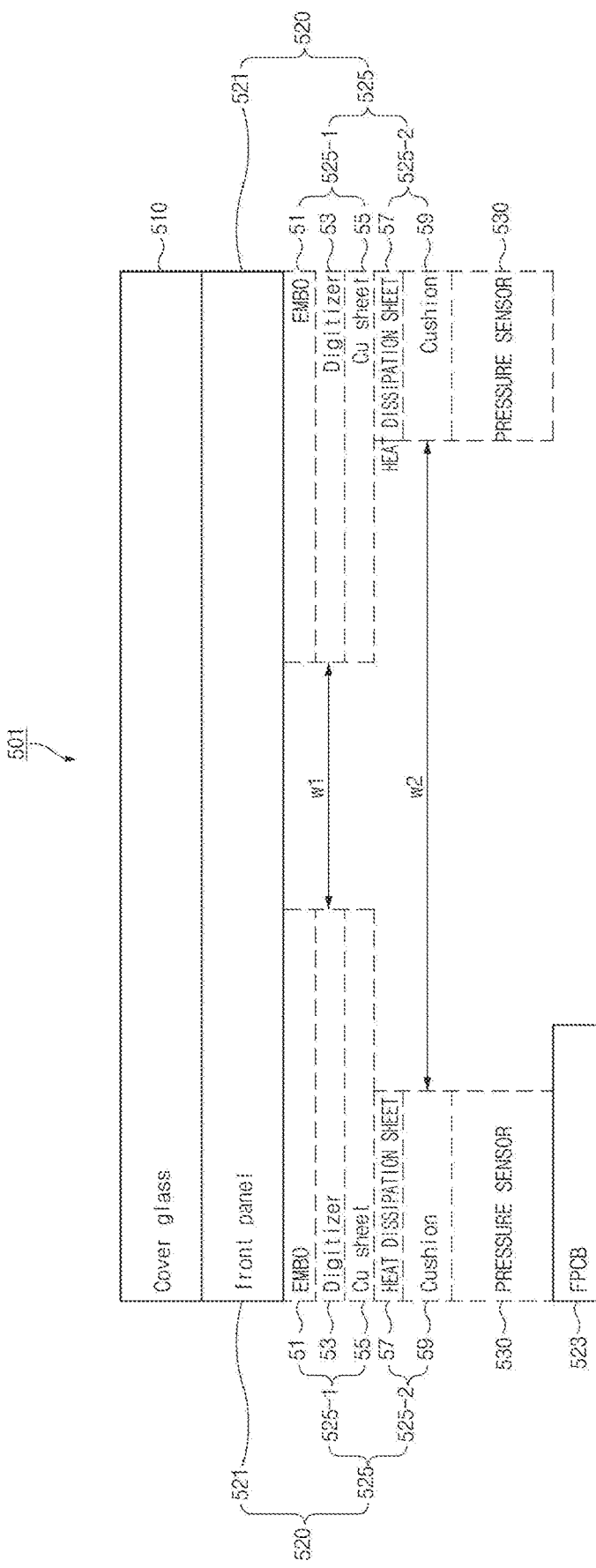
FIG. 5 is a sectional view illustrating an example electronic device according to an example embodiment of the present disclosure.

FIG. 5 is a sectional view illustrating an example electronic device according to an example embodiment of the present disclosure.

The sectional view illustrated in FIG. 5 corresponds to a sectional view in the state in which a biometric sensor module (e.g., the biometric sensor module 340 of FIG. 3) is not attached to a display 520. Referring to FIG. 5, an electronic device 501 (e.g., the electronic device 301 of FIG. 3) may include a cover glass 510 (e.g., the cover glass 310 of FIG. 3), the display (or a display panel) 520 (e.g., the display 320 of FIG. 3), and a pressure sensor 530 (e.g., the pressure sensor 330 of FIG. 3).

The cover glass 510 may be located in the top layer of the electronic device 501. The display 520 may be disposed below the cover glass 510. The display 520 may include a panel layer (or a front panel) 521 (e.g., the panel layer 421) and a layer 525 (e.g., the layer 425). According to an embodiment, the panel layer 521 may include at least one light-emitting element and may be disposed below the cover glass 510. According to an embodiment, the layer 525 may be disposed below the panel layer 521. According to an embodiment, the layer 525 may include a first layer 525-1 (e.g., the first layer 425-1) and a second layer 525-2 (e.g., the second layer 425-2). The first layer 525-1 may include, for example, a support member (e.g., EMBO) 51 having a pattern formed thereon, a digitizer (or an electronic pen sensor) 53 for receiving an input from an electronic pen, and a metal layer 55 (e.g., a copper layer). The support member 51 may absorb external shocks to the panel layer 521, may enhance an optical characteristic of the panel layer 521, and may visually hide a pattern included in the digitizer 53. The second layer 525-2 may include, for example, a heat dissipation sheet 57 for performing a heat dissipation function and a cushion layer 59 for absorbing external shocks. The stack structure of the first layer 525-1 and the second layer 525-2, which is illustrated in FIG. 5, is merely illustrative, and the layer 525 may not include some of the plurality of layers illustrated in FIG. 5, or may further include at least one other layer. Alternatively, the positions of at least some of the plurality of layers may be changed. For example, the layer 525 may not include the digitizer 53 and the metal layer 55 illustrated in FIG. 5. In another example, the layer 525 may not include the support member 51 and the heat dissipation sheet 57.

According to an embodiment, through-holes (or openings) formed through the first and second layers 525-1 and 525-2 may have different sizes, respectively. For example, the through-hole of the second layer 525-2 may have a width w2 larger than the width w1 of the through-hole of the first layer 525-1. Accordingly, the layer 525 may have a stepped structure formed by the first layer 525-1 and the second layer 525-2.

According to an embodiment, the pressure sensor 530 may be disposed below the layer 525. According to an embodiment, a printed circuit board 523 may be disposed below the pressure sensor 530. For example, as described with reference to FIG. 4A, the printed circuit board 523 may extend from one side of the display 520 (e.g., the panel layer 521) and may be folded toward a rear surface of the layer 525 and attached to the pressure sensor 530. According to an embodiment, the electronic device 501 may include the pressure sensor 530.

Figure 6:
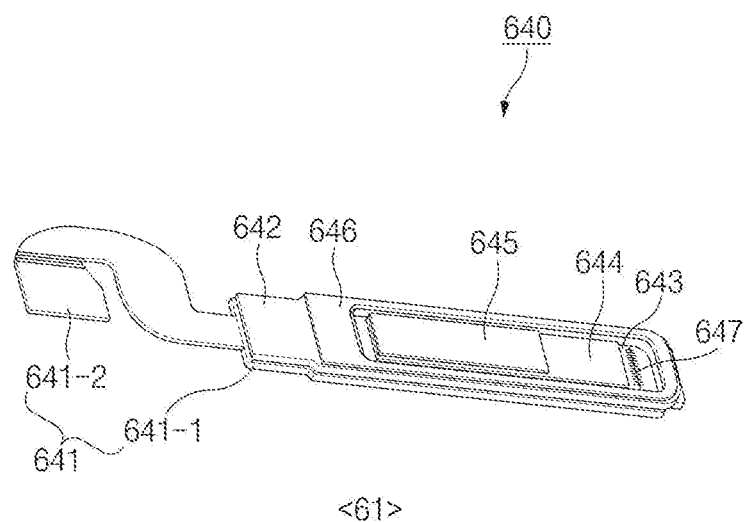
FIG. 6 is a diagram illustrating an example package structure of a biometric sensor module according to an example embodiment of the present disclosure.
Figure 6:
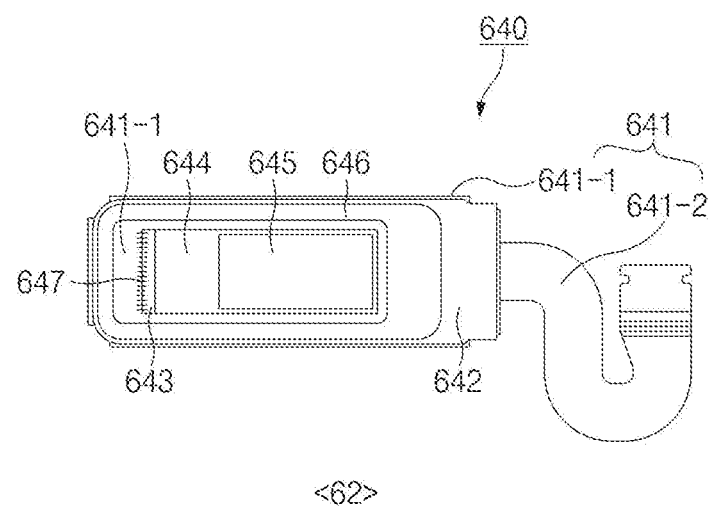
Figure 6:
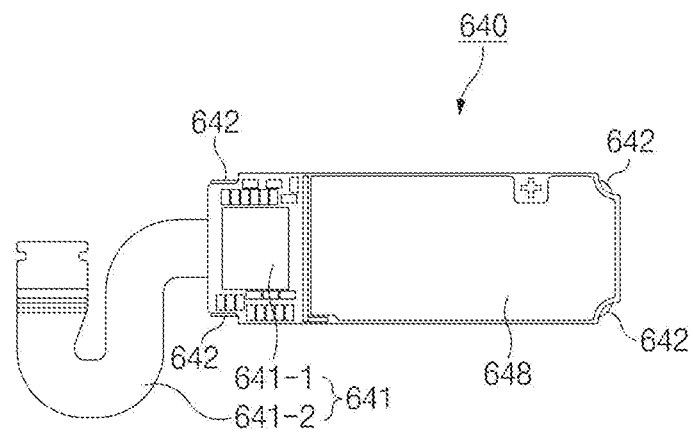

FIG. 6 is a diagram illustrating an example package structure of a biometric sensor module according to an example embodiment of the present disclosure.

In FIG. 6, diagram <61> illustrates a perspective view of a biometric sensor module (or a biometric sensor device or a biometric sensor circuit) (e.g., a fingerprint sensor) 640 (e.g., the biometric sensor module 340 of FIG. 3), diagram <62> illustrates a front view of the biometric sensor module 640, and diagram <63> illustrates a rear view of the biometric sensor module 640.

Referring to FIG. 6, the biometric sensor module 640 may include a printed circuit board 641, a housing 642, an image sensor (or an image sensor array) 643, an optical layer 644, an optical filter layer 645, an adhesive member 646, a conductive wire 647, and a magnetic screen layer 648 (e.g., a magnetic metal powder sheet). The image sensor 643, the optical layer 644, and the optical filter layer 645 may be combined to form one package structure and may be referred to as, for example, a biometric sensor. According to various embodiments, the biometric sensor module 640 may not include some of the elements illustrated in FIG. 6 and may further include elements not being illustrated in FIG. 6.

According to an embodiment, the printed circuit board 641 may include a rigid printed circuit board (RPCB) 641-1 and a flexible printed circuit board (FPCB) 641-2. The rigid printed circuit board 641-1 may include a passive element, a printed circuit, and a sensor IC for controlling the biometric sensor. The passive element, the printed circuit, and the sensor IC may be disposed on, for example, a rear surface of the rigid printed circuit board 641-1. The flexible printed circuit board 641-2 may extend from one side of the rigid printed circuit board 641-1. The flexible printed circuit board 641-2 (or a connecting part) may be electrically connected with another printed circuit board (e.g., the printed circuit board 423 of FIG. 4A) in the state of being attached to a display (e.g., the display 420 of FIG. 4A).

According to an embodiment, the housing 642 may be disposed on a surface (e.g., an upper surface) of the printed circuit board 641. According to an embodiment, the housing 642 may include an opening. At least an area (e.g., the entirety) of an upper surface of the housing 642 may be open such that the housing 642 has sidewalls surrounding the biometric sensor. For example, when viewed from above the biometric sensor module 640, the housing 642 may have the shape of "□" that surrounds the biometric sensor. In another example, when viewed from above the biometric sensor module 640, the housing 642 may have the shape of " ⊂ " or "11" by which a portion of the periphery of the biometric sensor is open. In the state in which the biometric sensor module 640 is attached to the display (e.g., the display 420 of FIG. 4A), the biometric sensor may face one surface of the display through the opening. The housing 642 may include, for example, a polymer, such as epoxy, and/or metal, such as stainless steel or aluminum.

According to an embodiment, the biometric sensor (e.g., the image sensor 643, the optical layer 644, and the optical filter layer 645) may be disposed on a surface (e.g., the upper surface) of the printed circuit board 641. The biometric sensor may be disposed inside the housing 642. For example, the biometric sensor may be disposed inside the housing 642 through the opening of the housing 642.

According to an embodiment, the image sensor (e.g., a CMOS or a CCD) 643 may be disposed on a surface (e.g., the upper surface) of the printed circuit board 641. The image sensor 643 may be, for example, an array type image sensor having a plurality of image sensors arranged at a specified interval. The image sensor 643 may obtain fingerprint information (or a fingerprint image) by using reflective light reflected by a user's finger.

According to an embodiment, the optical layer 644 may be disposed on the image sensor 643. For example, the optical layer 644 may improve an optical characteristic of reflective light reflected by an external object (e.g., a finger) and may enhance light receiving efficiency of the image sensor 643 by refracting the reflective light.

According to an embodiment, the optical filter layer 645 may be disposed on the optical layer 644. According to an embodiment, the optical filter layer 645 may be disposed on at least an area of the optical layer 644. The optical filter layer 645 may pass, for example, only light (e.g., visible light) in a specific wavelength range, which is reflected by an external object (e.g., a finger). For example, to obtain fingerprint information, the optical filter layer 645 may pass only light in a wavelength range required by the image sensor 643 or light (e.g., green light) in a wavelength range that easily passes through a hole formed in a panel layer (e.g., the panel layer 421 of FIG. 4) of the display. According to an embodiment, the optical filter layer 645 may include a poly ethylene terephthalate (PET) film.

According to an embodiment, the adhesive member 646 may be disposed on a surface (e.g., the upper surface) of the housing 642. The adhesive member 646 may be attached to a surface (e.g., a rear surface) of the display to attach the biometric sensor module 640 to the display.

According to an embodiment, the conductive wire 647 may electrically connect the printed circuit board 641 and the biometric sensor (e.g., the image sensor 643). The conductive wire 647 may include, for example, a plurality of wires connecting the printed circuit board 641 and the image sensor 643. Fingerprint information obtained by the image sensor 643 may be transmitted to the sensor IC, which is disposed on the printed circuit board 641, through the conductive wire 647.

According to an embodiment, the magnetic screen layer 648 may be attached to a surface (e.g., a rear surface) of the printed circuit board 641. The magnetic screen layer 648 may include, for example, magnetic powder and/or metal powder. A sensor mounting area may be formed in a layer (e.g., the layer 425 of FIG. 4A) of the display. Accordingly, a hole may be formed in an area of a digitizer included in the layer. The magnetic screen layer 648 may compensate for a magnetic-field change caused by the hole formed in the layer to prevent performance degradation of the digitizer. The magnetic screen layer 648 may be omitted in the case where the layer does not include the digitizer.

Figure 7A:
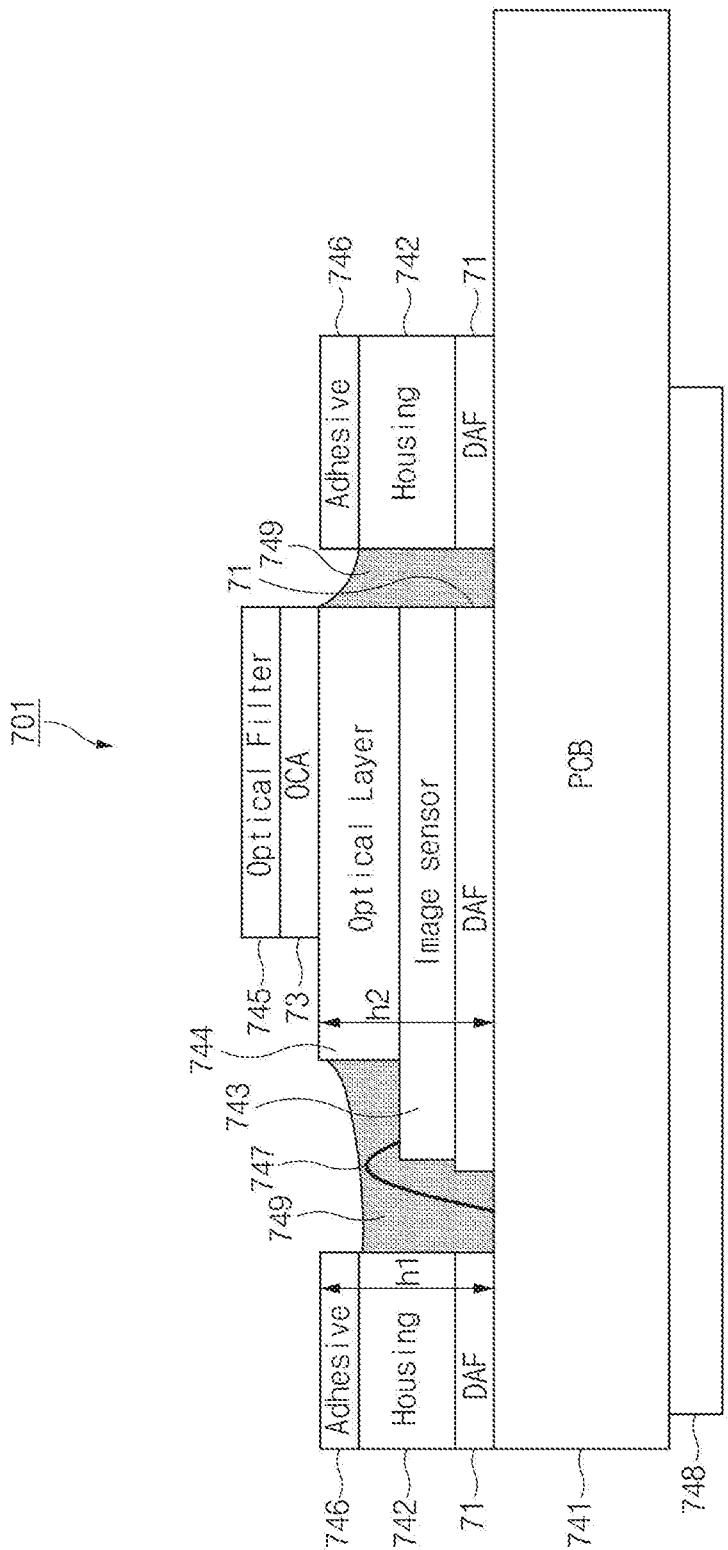
FIG. 7A is a sectional view illustrating an example biometric sensor module according to an example embodiment of the present disclosure.

FIG. 7A is a sectional view illustrating an example biometric sensor module according to an example embodiment of the present disclosure.

Referring to FIG. 7A, a biometric sensor module 701 (e.g., the biometric sensor module 640 of FIG. 6) may include a printed circuit board 741 (e.g., the printed circuit board 641), a housing 742 (e.g., the housing 642), an image sensor (or an image sensor array) 743 (e.g., the image sensor 643), an optical layer 744 (e.g., the optical layer 644), an optical filter layer 745 (e.g., the optical filter layer 645), an adhesive member 746 (e.g., the adhesive member 646), a conductive wire 747 (e.g., the conductive wire 647), a magnetic screen layer 748 (e.g., the magnetic screen layer 648), and a protective member 749.

According to an embodiment, the housing 742 and the image sensor 743 may be disposed on the printed circuit board 741. For example, the housing 742 and the image sensor 743 may be attached to the printed circuit board 741 by a first adhesive film (e.g., a die attach film (DAF)) 71.

According to an embodiment, the optical filter layer 745 may be disposed on at least an area of the optical layer 744. For example, the optical filter layer 745 may be attached to the optical layer 744 by a second adhesive film 73 (e.g., an optically clear adhesive (OCA) film, an optically clear resin (OCR) film, or a die attach film (DAF)). The second adhesive film 73 may be transparent to ensure an optical characteristic.

According to an embodiment, the protective member 749 may be disposed in a space formed by the housing 742, a biometric sensor (e.g., the image sensor 743, the optical layer 744, and the optical filter layer 745), and the printed circuit board 741 to secure the housing 742 and the biometric sensor. According to an embodiment, the protective member 749 may surround the conductive wire 747 to secure and protect the conductive wire 747 from the outside. The conductive wire 747 may be completely separated from the outside by the protective member 749. The protective member 749 may include, for example, an epoxy resin or silicone.

According to an embodiment, the height h1 from the printed circuit board 741 to the adhesive member 746 may be greater than or equal to the height h2 from the printed circuit board 741 to the optical layer 744. Accordingly, the biometric sensor may be separated from the outside in the state in which the biometric sensor module 701 is attached to a display (e.g., the display 320 of FIG. 3).

FIG. 7B is a sectional view illustrating an example biometric sensor module according to an example embodiment of the present disclosure.

Referring to FIG. 7B, a biometric sensor module 703 (e.g., the biometric sensor module 640 of FIG. 6) may include the main printed circuit board 741, a sub-printed circuit board 79, the housing 742, the image sensor (or the image sensor array) 743, the optical layer 744, the optical filter layer 745, the adhesive member 746, the conductive wire 747, the magnetic screen layer 748, and the protective member 749.

According to an embodiment, the sub-printed circuit board 79 may be disposed on the main printed circuit board 741. For example, the sub-printed circuit board 79 may be attached to the main printed circuit board 741 through at least one third adhesive member 75. According to an embodiment, the third adhesive member 75 may include, for example, a conductive material and may electrically connect the main printed circuit board 741 and the sub-printed circuit board 79. For example, the third adhesive member 75 may include conductive epoxy or solder.

According to an embodiment, the image sensor 743 may be disposed on the sub-printed circuit board 79. For example, the image sensor 743 may be attached to the sub-printed circuit board 79 through the first adhesive film 71 (e.g., a die attach film (DAF)).

Figure 8:
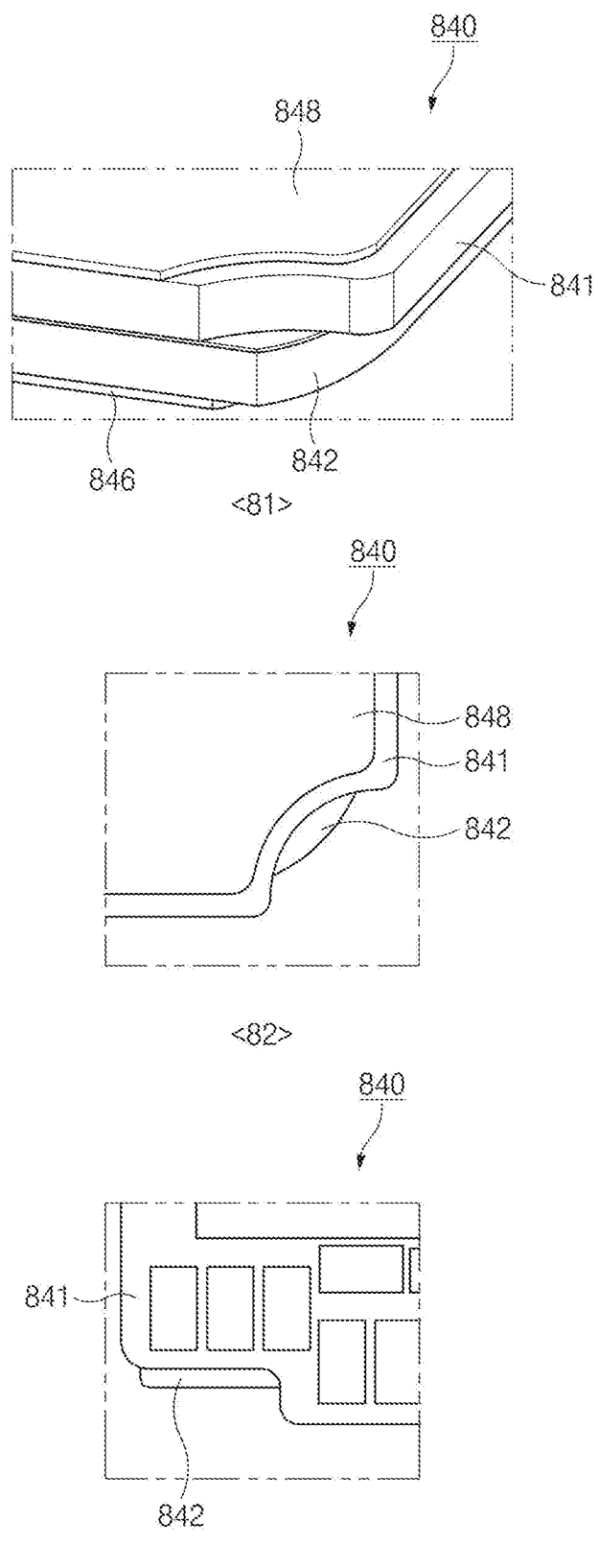
FIG. 8 is a diagram illustrating a portion of an example package structure of a biometric sensor module according to an example embodiment of the present disclosure.

FIG. 8 is a diagram illustrating a portion of an example package structure of a biometric sensor module according to an example embodiment of the present disclosure.

In FIG. 8, diagram <81> illustrates a rear perspective view of a first corner portion of a biometric sensor module (e.g., a biometric sensor) 840 (e.g., the biometric sensor module 640), diagram <82> illustrates a rear view of the first corner portion of the biometric sensor module 840, and diagram <83> illustrates a rear view of a second corner portion of the biometric sensor module 840.

Referring to FIG. 8, the biometric sensor module 840 may include a printed circuit board 841 (e.g., the printed circuit board 641), a housing 842 (e.g., the housing 642), an adhesive member 846 (e.g., the adhesive member 646), and a magnetic screen layer 848 (e.g., the magnetic screen layer 648). According to an embodiment, an area of the housing 842 may protrude outside the printed circuit board 841. For example, a corner of the printed circuit board 841 may have an inwardly concave shape, and a corner of the housing 842 may protrude outside the printed circuit board 841. According to another embodiment, the entire area of the housing 842 may not protrude outside the printed circuit board 841.

Since the boundary of the corner of the printed circuit board 841 is located inward of the boundary of the corner of the housing 842, a second adhesive member (e.g., a second adhesive member 92 of FIG. 9), when being applied, may flow down the corner portion of the housing 842 and may be effectively applied to an area between the biometric sensor module 840 and a display.

Figure 9:
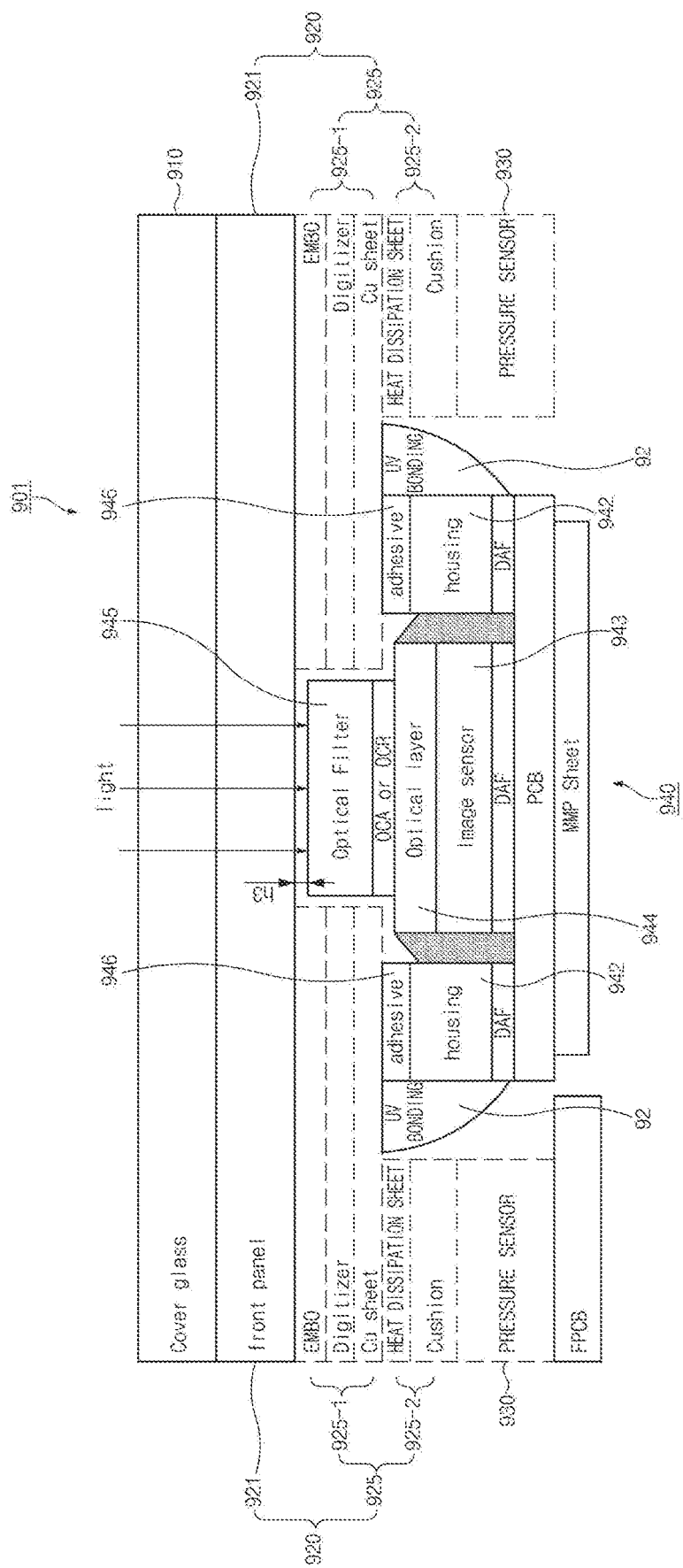
FIG. 9 is a sectional view illustrating an example electronic device according to an example embodiment of the present disclosure.

FIG. 9 is a sectional view illustrating an example electronic device according to an example embodiment of the present disclosure.

The sectional view illustrated in FIG. 9 corresponds to a sectional view in the state in which a biometric sensor module 940 is attached to a display 920. Referring to FIG. 9, an electronic device 901 (e.g., the electronic device 301 of FIG. 3) may include a cover glass 910 (e.g., the cover glass 310 of FIG. 3), the display (or the display panel) 920 (e.g., the display 320 of FIG. 3), a pressure sensor 930 (e.g., the pressure sensor 330 of FIG. 3), and the biometric sensor module 940 (e.g., the biometric sensor module 340 of FIG. 3).

According to an embodiment, the biometric sensor module 940 may be attached to a rear surface of the display 920 after passing through a sensor mounting area (e.g., the sensor mounting area 427 of FIG. 4A) formed in the display 920 and a sensor mounting area (e.g., the sensor mounting area 431 of FIG. 4A) formed in the pressure sensor 930. For example, a first adhesive member 946 (e.g., the adhesive member 646) of the biometric sensor module 940 may be attached to a surface (e.g., a rear surface) of a first layer 925-1 (e.g., the first layer 425-1) of a layer 925 (e.g., the layer 425). In the state in which the biometric sensor module 940 is attached to the display 920, a biometric sensor (e.g., an image sensor 943 (e.g., the image sensor 643), an optical layer 944 (e.g., the optical layer 644), and an optical filter layer 945 (e.g., the optical filter layer 645)) may face a panel layer 921 (e.g., the panel layer 421). According to an embodiment, the optical filter layer 945 may be spaced apart from the panel layer 921 by a specified distance h3 to ensure performance of the biometric sensor module 940.

According to an embodiment, the electronic device 901 may include the second adhesive member 92 for attaching the biometric sensor module 940 to the display 920. The second adhesive member 92 may be inserted between an outer side of a housing 942 and an inner side of the layer 925 to secure the biometric sensor module 940 to the display 920. The adhesive force of the biometric sensor module 940 to the display 920 may be enhanced by doubly attaching the biometric sensor module 940 to the display 920 through the first adhesive member 946 and the second adhesive member 92. According to an embodiment, the second adhesive member 92 may include a UV adhesive, such as a UV ink or a UV curable resin, which is curable by UV light.

In the embodiment described with reference to FIG. 9, the biometric sensor module 940 has been described as being attached to the display 920 through the first adhesive member 946. However, the biometric sensor module 940 may be attached to the display 920 by a pressing method without the first adhesive member 946, or may be attached to the display 920 through an additional mechanical fixing method (e.g., a screw, a fixing recess, a fixing member, or the like).

Figure 10A:
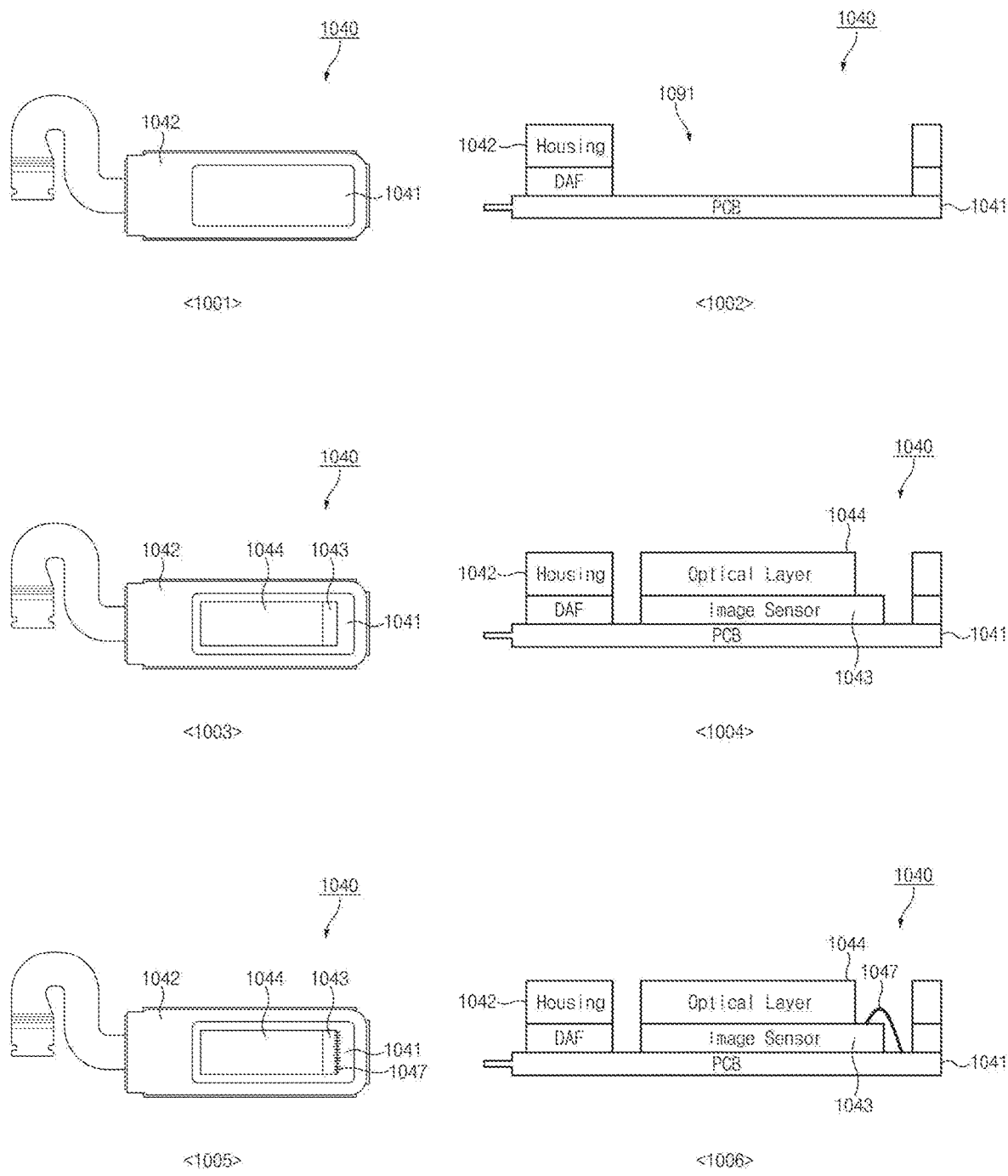
FIGS. 10A and 10B are diagrams illustrating an example process of manufacturing a biometric sensor, according to an example embodiment of the present disclosure.
Figure 10B:
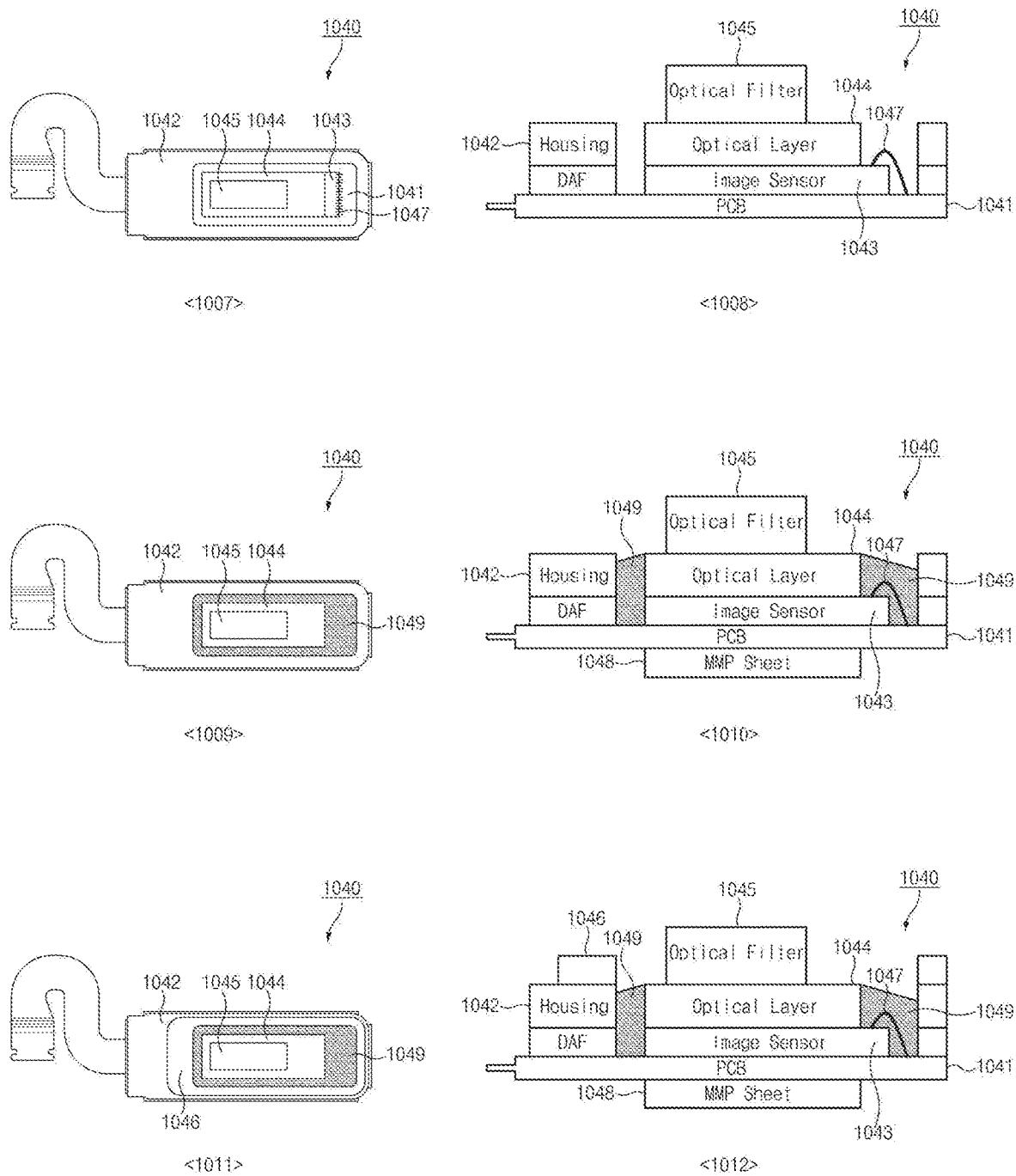

FIGS. 10A and 10B are diagrams illustrating an example process of manufacturing a biometric sensor, according to an example embodiment of the present disclosure.

Referring to diagrams <1001> and <1002> of FIG. 10A, a biometric sensor module 1040 (e.g., the biometric sensor module 640 of FIG. 6) may include a printed circuit board 1041 (e.g., the printed circuit board 641 of FIG. 6) and a housing 1042 (e.g., the housing 642 of FIG. 6). The housing 1042 may be disposed on an upper surface of the printed circuit board 1041 and may include an opening 1091. Referring to diagrams <1003> and <1004> of FIG. 10A, a biometric sensor (e.g., an image sensor 1043 (e.g., the image sensor 643 of FIG. 6) and an optical layer 1044 (e.g., the optical layer 644 of FIG. 6)) may be disposed on the upper surface of the printed circuit board 1041. For example, the image sensor 1043 may be disposed on at least an area in the opening 1091 of the housing 1042, and the optical layer 1044 may be disposed on at least an area of the image sensor 1043. Referring to diagrams <1005> and <1006> of FIG. 10A, the printed circuit board 1041 and the image sensor 1043 may be electrically connected using a conductive wire 1047 (e.g., the conductive wire 647 of FIG. 6) in the state in which the biometric sensor is disposed on the printed circuit board 1041. The printed circuit board 1041 and the image sensor 1043 may be electrically connected through, for example, a plurality of conductive wires.

Referring to diagrams <1007> and <1008> of FIG. 10B, an optical filter layer 1045 (e.g., the optical filter layer 645 of FIG. 6) may be disposed on an upper surface of the optical layer 1044. The optical filter layer 1045 may be disposed on at least an area of the optical layer 1044. The optical filter layer 1045 may be attached to the optical layer 1044 through, for example, an optically clear adhesive (OCA) film. Referring to diagrams <1009> and <1010> of FIG. 10B, a protective member 1049 (e.g., the protective member 749 of FIG. 7A) may be disposed in a space formed by the housing 1042, the biometric sensor (e.g., the image sensor 1043, the optical layer 1044, and the optical filter layer 1045), and the printed circuit board 1041. According to an embodiment, the protective member 1049 may be formed to completely surround the conductive wire 1047 to separate the conductive wire 1047 from the outside. According to an embodiment, a magnetic screen layer 1048 (e.g., the magnetic screen layer 648 of FIG. 6) may be attached to a rear surface of the printed circuit board 1041. Referring to diagrams <1011> and <1012> of FIG. 10B, an adhesive member 1046 may be disposed on at least an area of the housing 1042. The biometric sensor module 1040 may be attached to a rear surface of a display (e.g., the display 320 of FIG. 3) through the adhesive member 1046.

Electronic devices according to various example embodiments disclosed herein may be various forms of devices. The electronic devices may include at least one of, for example, a portable communication device (e.g., a smartphone), a computer device (e.g., a personal digital assistant (PDA), a tablet personal computer (PC), a laptop PC, a desktop PC, a workstation, or a server), a portable multi-media device (e.g., an e-book reader or an MP3 player), a portable medical device (e.g., a heartbeat measuring device, a blood glucose monitoring device, a blood pressure measuring device, or a body temperature measuring device), a camera, and a wearable device. The wearable device may include at least one of an accessory type (e.g., a watch, a ring, bracelets, anklets, a necklace, glasses, a contact lens, or a head-mounted-device (HMD)), a fabric or garment-integrated type (e.g., an electronic apparel), a body-attached type (e.g., a skin pad or tattoos), and a bio-implantable type (e.g., an implantable circuit). In some embodiments, the electronic devices may include at least one of, for example, a television (TV), a digital versatile disc (DVD) player, an audio device, an audio accessory device (e.g., a speaker, headphones, or a headset), a refrigerator, an air conditioner, a vacuum cleaner, an oven, a microwave oven, a washing machine, an air cleaner, a set-top box, a home automation control panel, a security control panel, a game console, an electronic dictionary, an electronic key, a camcorder, and an electronic picture frame, or the like, but are not limited thereto.

In another embodiment, the electronic devices may include at least one of a navigation device, a Global Navigation Satellite System (GNSS), an event data recorder (EDR) (e.g., a black box for a car, a ship, or a plane), a vehicle infotainment device (e.g., a head-up display for a car), an industrial or home robot, a drone, an automated teller machine (ATM), a point of sales (POS) device, a measuring instrument (e.g., a water meter, an electricity meter, or a gas meter) and internet of things (e.g., a light bulb, a sprinkler device, a fire alarm, a thermostat, or a street lamp), or the like, but are not limited thereto. The electronic devices according to various embodiments of the present disclosure are not limited to the above-described devices and may complexly provide functions of a plurality of devices, similarly to a smartphone having a function of measuring personal biometric information (e.g., a heart rate or blood glucose). In this disclosure, the term "user" may refer to a person who uses an electronic device or may refer to a device (e.g., an artificial intelligence electronic device) that uses the electronic device.

Various example embodiments of the present disclosure and the terms used herein are not intended to limit the technology set forth herein to specific embodiments, and those of ordinary skill in the art will recognize that modifications, equivalents, and/or alternatives on the various embodiments described herein can be variously made without departing from the scope and spirit of the present disclosure. With regard to description of drawings, similar elements may be marked by similar reference numbers. The terms of a singular form may include plural forms unless otherwise specified. In this disclosure, the expressions "A or B", "at least one of A and/or B", "A, B, or C", or "at least one of A, B, and/or C", and the like may include any and all combinations of one or more of the associated listed items. The terms, such as "first", "second", and the like may be used to refer to various elements regardless of the order and/or the priority and to distinguish the relevant elements from other elements, but do not limit the elements. When an element (e.g., a first element) is referred to as being "(operatively or communicatively) coupled with/to" or "connected to" another element (e.g., a second element), the element may be directly coupled with/to or connected to the other element or an intervening element (e.g., a third element) may be present.

According to the situation, the expression "adapted to or configured to" used in this disclosure may be used interchangeably with, for example, the expression "suitable for", "having the capacity to", "adapted to", "made to", "capable of", or "designed to" in hardware or software. The expression "a device configured to" may refer to a situation in which the device is "capable of" operating together with another device or other components. For example, a "processor set to (or configured to) perform A, B, and C" may refer, for example, and without limitation, to a dedicated processor (e.g., an embedded processor) for performing corresponding operations or a generic-purpose processor (e.g., a central processing unit (CPU) or an application processor) that performs corresponding operations by executing one or more programs stored in a memory device (e.g., the memory 130).

The term "module" used in this disclosure may include a unit configured with hardware, software, or firmware or any combinations thereof, and may be used interchangeably with, for example, the terms "logic", "logical block", "component" or "circuit". The module may be an integrated component or may be a minimum unit for performing one or more functions or a part thereof. For example, the module may include, for example, and without limitation, a dedicated processor, a CPU, an application-specific integrated circuit (ASIC) or a field-programmable gate arrays (FPGAs), or the like.

At least a part of devices or methods according to various embodiments may be implemented with instructions stored in the form of a program in a computer-readable storage medium (e.g., the internal memory 136 or the external memory 138). The instructions, when executed by a processor (e.g., the processor 120), may allow the processor to perform functions corresponding to the instructions directly or by using other elements under the control of the processor. The instructions may include codes generated or executed by a compiler or an interpreter.

Elements (e.g., modules or programs) according to various embodiments may each be configured with a single entity or a plurality of entities, and some of the above-described corresponding sub-elements may be omitted, or other sub-elements may be further included. Alternatively or additionally, some elements (e.g., modules or programs) may be combined together to form one entity, and the functions of the elements may be performed in the same manner as before the combination. Operations performed by modules, programs, or other elements according to various embodiments may be executed sequentially, in parallel, repeatedly, or in a heuristic method. In addition, some of the operations may be executed in different sequences or may be omitted. Alternatively, other operations may be added.

While the present disclosure has been illustrated and described with reference to various example embodiments thereof, it will be understood by those skilled in the art that various changes in form and details may be made therein without departing from the spirit and scope of the present disclosure as defined by the appended claims and their equivalents.

What is claimed is:

1. A mobile electronic device comprising:
a display panel comprising a plurality of layers including a front panel comprising a plurality of pixels and a metal sheet layer including a first opening defined therein;
a housing structure having a second opening;
a biometric sensor disposed below the display panel via the housing structure so that an upper surface of the biometric sensor faces a rear surface of the front panel through at least a portion of the second opening of the housing structure and the first opening in the metal sheet layer,
a first flexible printed circuit board electrically coupled to the biometric sensor, the first flexible printed circuit board disposed below the biometric sensor and at least partially overlapping the housing structure; and
a metallic layer integrally formed on a rear surface of the first flexible printed circuit board and at least partially overlapping the biometric sensor and at least partially overlapping the housing structure;
wherein the upper surface of the biometric sensor is spaced apart from the rear surface of the front panel via an unoccupied space formed by at least the portion of the second opening of the housing structure in addition to the first opening of the metal sheet layer; and
wherein the mobile electronic device is configured so that light emitted by a portion of the plurality of pixels is to be reflected by a finger over a front surface of the mobile electronic device and is to be transmitted through each of the front panel, the first opening in the metal sheet layer, and at least the portion of the second opening of the housing structure before being received by the biometric sensor.

2. The mobile electronic device of claim 1, further comprising a second flexible printed circuit board electrically coupled to a layer extending from the display panel, the second flexible printed circuit board having a third opening defined therein that overlaps an area where the biometric sensor is provided when the layer extending from the display panel is bent so as to dispose the second flexible printed circuit board at a rear side of the display panel.

3. The mobile electronic device of claim 2,
wherein the housing structure is attached to at least part of an upper surface of the first flexible printed circuit board by an adhesive,
wherein the biometric sensor is disposed at least partially in the second opening of the housing structure and configured such that a signal related to biometric information is to pass through the display panel and reach the upper surface of the biometric sensor.

4. The mobile electronic device of claim 1,
wherein the housing structure is attached to at least part of an upper surface of the first flexible printed circuit board by an adhesive,
wherein the biometric sensor is disposed at least partially in the second opening of the housing structure and configured such that a signal related to biometric information is to pass through the display panel and reach the upper surface of the biometric sensor.

5. The mobile electronic device of claim 1,
wherein the housing structure is attached to at least part of a rear surface of the display panel by an adhesive at a periphery of the second opening, wherein the biometric sensor is disposed at least partially in the second opening of the housing and configured such that a signal related to biometric information is to pass through the display panel and reach the upper surface of the biometric sensor.

6. A mobile electronic device comprising:
a display panel comprising each of a front panel comprising a plurality of pixels and a metal sheet layer having a first opening defined therein;
a biometric sensor disposed below the display panel so that an upper surface of the biometric sensor is spaced apart from the front panel via an unoccupied space in an area where the first opening in the metal sheet layer is provided; and
a first flexible circuit board electrically coupled to the display panel and disposed at a rear side of the display panel, the first flexible circuit board having a shape with a void area corresponding to at least an area where the biometric sensor is provided,
wherein the mobile electronic device is configured so that light emitted by a portion of the plurality of pixels is to be reflected by a finger over a front surface of the mobile electronic device and is to be transmitted through each of the front panel, the first opening in the metal sheet layer, and the void area before being received by the biometric sensor.

7. The mobile electronic device of claim 6, wherein the first flexible printed circuit board is electrically coupled to a layer extending from the display panel, and the layer extending from the display panel is bended so as to dispose the first flexible printed circuit board at a rear side of the display panel.

8. The mobile electronic device of claim 7, further comprising
a second flexible printed circuit board disposed below the biometric sensor and electrically coupled to the biometric sensor; and
a metallic layer integrally formed on a rear surface of the second flexible printed circuit board and at least partially overlapping the biometric sensor as viewed from above.

9. The mobile electronic device of claim 6, further comprising
a second flexible printed circuit board disposed below the biometric sensor and electrically coupled to the biometric sensor; and
a metallic layer integrally formed on a rear surface of the second flexible printed circuit board and at least partially overlapping the biometric sensor as viewed from above.

10. The mobile electronic device of claim 9, wherein the first flexible printed circuit board is electrically coupled to a layer extending from the display panel, and the layer extending from the display panel is bent so as to dispose the first flexible printed circuit board at a rear side of the display panel.

11. The mobile electronic device of claim 6, further comprising:
a rigid printed circuit board disposed below the biometric sensor and electrically coupled to the biometric sensor; and
a metallic layer integrally formed on a rear surface of the rigid printed circuit board and at least partially overlapping the biometric sensor as viewed from above.

12. The mobile electronic device of claim 11, wherein the first flexible printed circuit board is electrically coupled to a layer extending from the display panel, and the layer extending from the display panel is bent so as to dispose the first flexible printed circuit board at a rear side of the display panel.

13. The mobile electronic device of claim 6, further comprising:
a housing structure having a second opening, wherein the housing structure is attached to at least part of a rear surface of the display panel by an adhesive at a periphery of the second opening, wherein the biometric sensor is disposed at least partially in the second opening of the housing and configured such that a signal related to biometric information is to pass through the display panel and reach the upper surface of the biometric sensor.

14. A mobile electronic device comprising:
a display panel comprising a plurality of layers including a front panel comprising a plurality of pixels and a metal inclusive sheet layer including a first opening defined therein;
a housing comprising a second opening defined therein, wherein the second opening defined in the housing extends through the housing;
a biometric sensor disposed below the display panel via the housing so that an upper surface of the biometric sensor faces a rear surface of the front panel through at least a portion of the second opening of the housing and the first opening in the metal inclusive sheet layer,
wherein the upper surface of the biometric sensor is spaced apart from the rear surface of the front panel via an unoccupied space formed by at least the portion of the second opening of the housing in addition to the first opening of the metal inclusive sheet layer; and
a first flexible circuit board electrically coupled to the display panel and disposed at a rear side of the display panel, the first flexible circuit board having a shape with a void area corresponding to at least an area where the biometric sensor is provided,
wherein the mobile electronic device is configured so that light emitted by a portion of the plurality of pixels is to be reflected by a finger over a front surface of the mobile electronic device and is to be transmitted through each of the front panel, the first opening in the metal inclusive sheet layer, the void area, and at least the portion of the second opening of the housing before being received by the biometric sensor.

15. The mobile electronic device of claim 14, further comprising
a second flexible printed circuit board disposed below the biometric sensor and electrically coupled to the biometric sensor; and
a metallic layer integrally formed on a rear surface of the second flexible printed circuit board.

16. The mobile electronic device of claim 15, wherein the first flexible printed circuit board is electrically coupled to a layer extending from the display panel, and the layer extending from the display panel is bent so as to dispose the first flexible printed circuit board at the rear side of the display panel.

17. The mobile electronic device of claim 16,
wherein the housing is attached to at least part of an upper surface of the first flexible printed circuit board by an adhesive,
wherein the biometric sensor is disposed at least partially in the second opening of the housing and configured such that a signal related to biometric information is to pass through the display panel and reach the upper surface of the biometric sensor.

18. The mobile electronic device of claim 14, further comprising
a rigid printed circuit board disposed below the biometric sensor and electrically coupled to the biometric sensor; and
a metallic layer integrally formed on a rear surface of the rigid printed circuit board.

19. The mobile electronic device of claim 18, wherein the first flexible printed circuit board is electrically coupled to a layer extending from the display panel, and the layer extending from the display panel is bent so as to dispose the first flexible printed circuit board at the rear side of the display panel.

20. The mobile electronic device of claim 18,
wherein the housing is attached to at least part of an upper surface of the first flexible printed circuit board by an adhesive,
wherein the biometric sensor is disposed at least partially in the second opening of the housing and configured such that a signal related to biometric information is to pass through the display panel and reach the upper surface of the biometric sensor.

21. The mobile electronic device of claim 14, wherein the first flexible printed circuit board is electrically coupled to a layer extending from the display panel, and the layer extending from the display panel is bent so as to dispose the first flexible printed circuit board at the rear side of the display panel.

22. The mobile electronic device of claim 14,
wherein the housing is attached to at least part of a rear surface of the display panel by an adhesive at a periphery of the second opening, wherein the biometric sensor is disposed at least partially in the second opening of the housing and configured such that a signal related to biometric information is to pass through the display panel and reach the upper surface of the biometric sensor.

23. The mobile electronic device of claim 14,
wherein the first flexible printed circuit board (FPCB) is electrically coupled to a layer extending from the display panel, wherein the layer extending from the display panel is bent so as to dispose the first FPCB at the rear side of the display panel, wherein the first FPCB includes a first portion disposed at a first side of the mobile electronic device and a second portion disposed at a second side of the mobile electronic device; and
wherein the biometric sensor includes a fingerprint sensor, wherein the fingerprint sensor is positioned relative to the first FPCB so that light reflected by a finger is to pass between the first portion and the second portion of the first FPCB before being received by the fingerprint sensor.

* * * * *